(12) United States Patent
Ichimiya et al.

(10) Patent No.: US 6,651,236 B2
(45) Date of Patent: Nov. 18, 2003

(54) SEMICONDUCTOR INTEGRATED CIRCUIT DEVICE, AND METHOD OF PLACEMENT AND ROUTING FOR SUCH DEVICE

(75) Inventors: Junji Ichimiya, Ikeda (JP); Keiichi Yoshioka, Sanda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/951,071

(22) Filed: Sep. 13, 2001

(65) Prior Publication Data

US 2002/0038448 A1 Mar. 28, 2002

(30) Foreign Application Priority Data

Sep. 13, 2000 (JP) .......................................... 2000-278646

(51) Int. Cl.[7] .............................................. G06F 17/50

(52) U.S. Cl. ............................................. 716/8; 257/678

(58) Field of Search ........................... 716/2, 5, 7, 8, 716/10, 11, 14; 257/678

(56) References Cited

U.S. PATENT DOCUMENTS

| | | | | | |
|---|---|---|---|---|---|
| 6,035,106 | A | * | 3/2000 | Carruthers et al. | 716/11 |
| 6,463,567 | B1 | * | 10/2002 | Kozai | 716/2 |
| 2002/0020901 | A1 | * | 2/2002 | Yamaguchi | 257/678 |

* cited by examiner

Primary Examiner—Matthew Smith
Assistant Examiner—Thuan V Do
(74) Attorney, Agent, or Firm—Cooper & Dunham LLP

(57) ABSTRACT

A semiconductor integrated circuit device fabricated with reduced size and wiring to alleviate wiring delay, and an improved placement and routing method of the building-block type for appropriate use in deep-submicron processes for fabricating such semiconductor device. This semiconductor integrated circuit device includes at least a plurality of integrated circuit blocks to be interconnected by wiring, and a terminal cell including a terminal target metal that is different from, and formed in a layer higher at least by one layer than, ordinary target metals originally included in a block netlist. The interconnection among the integrated circuit blocks is carried out by way of the block terminals provided in circumferential edge portions on the block layout and the terminal target of the terminal cell.

36 Claims, 22 Drawing Sheets

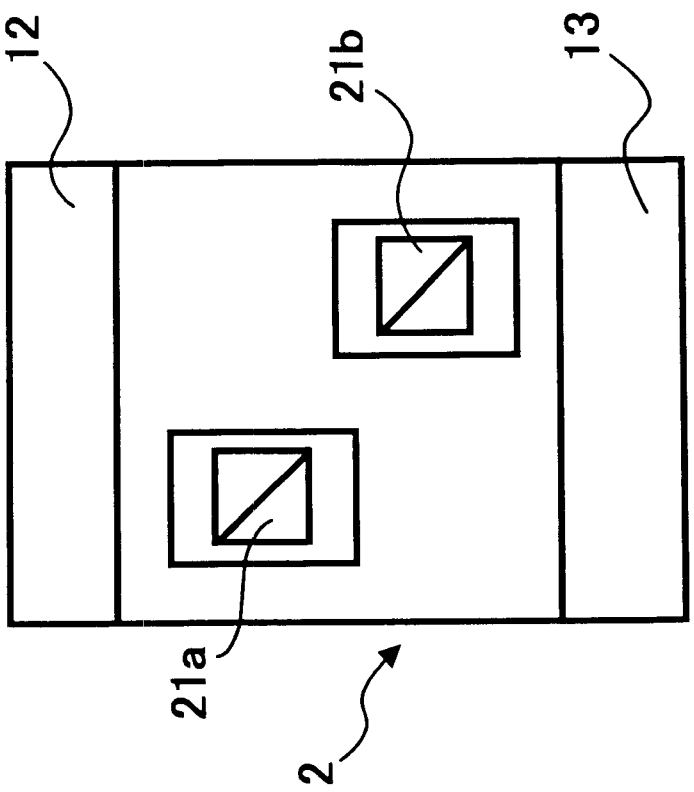
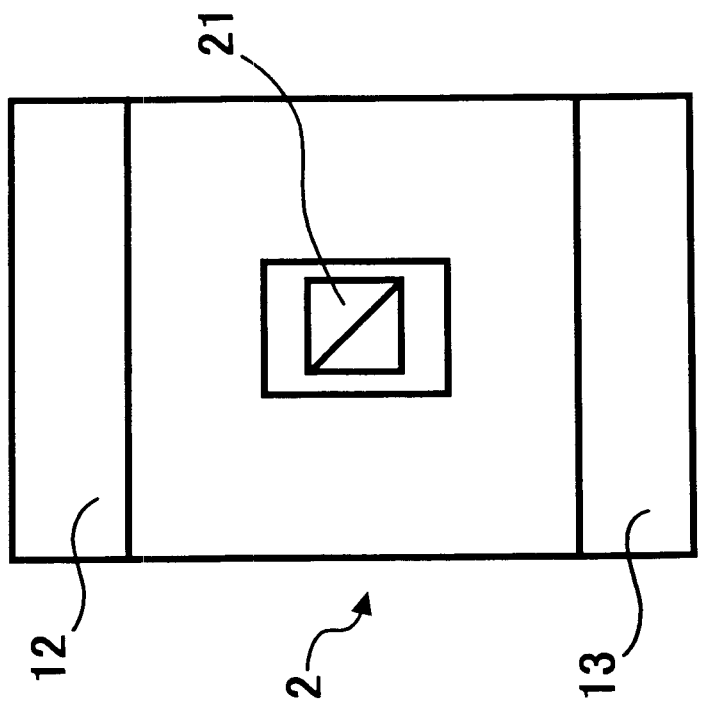

SEMICONDUCTOR INTEGRATED CIRCUIT DEVICE, AND METHOD OF PLACEMENT AND ROUTING FOR SUCH DEVICE

BACKGROUND

1. Field

This patent specification relates generally to a semiconductor integrated circuit device, and to a method for fabricating such device, and more specifically to a placement and routing method of the building-block type for use in deep-submicron processes for reducing the wiring delay and facilitating tapering control of connecting wires, and a device fabricated by this layout method.

2. Discussion of the Background

In the processes for designing a large-scale integrated semiconductor circuit device, respective blocks of the device are generally designed in parallel to complement device characteristics with one another.

During the designing the large-scale device, the building-block type of method is utilized, in which the circuit of the device is divided into a plurality of blocks and each of the blocks is thus designed at the same time. The overall design of the device is then carried out by integrating these constituent blocks.

FIG. 1 includes a flow chart illustrating a basic process flow in the building-block method for designing a block layout. The building-block method is divided broadly into two processes; (1) The process of forming a block layout and (2) interconnecting the plural block. Namely, a block netlist is first tabulated according to several lists on the circuits in the block, and automatic routing for the block layout is then carried out. Subsequently, a TOP netlist, list for the first layer components, is tabulated and connections between the plural blocks are carried out.

In contrast to the building-block method, an alternative or flat layout designing method is illustrated in FIG. 2, in which a TOP netlist is tabulated and the connections by automatic routing are carried out.

The designing in the flat layout method is therefore carried out entirely in a planar fashion as described above. Since the layout in the building-block method is carried out in the unit of device function, in contrast, circuits of each functional component can be designed without undue spread of each layout area, which is more advantageous to secure the characteristics of each block.

FIG. 3 is a block diagram illustrating a block layout formed by the previous building-block method having blocks and interconnections therebetween. The interconnections by this method are designed as shown in FIG. 3, in which block layout is first made for each of the blocks A and B, then connections are carried out between the thus prepared blocks.

In the building-block method, each of the blocks 100 is provided with a plurality of relay terminals 101 in the edge portion to be utilized for relaying signals. In addition, among the plurality of the relay terminals shown in FIG. 3, the terminals A1 and B1 of the blocks A and B, respectively, are interconnected in routing process step.

In addition, there also provided inside the block 100 are terminals 102, from which another connection is also made with the above mentioned relay terminal 101. For example, with the relay terminal A1 (FIG. 3), a wire is connected which is originated from an internal terminal A1' and extends to a relay terminal in the edge portion. In a similar manner, another wiring from internal terminal 102 (B1') is also provided to a relay terminal 101 (D1').

In those pervious building-block method, however, several drawbacks are encountered are such as, for example, unnecessarily long wiring for the interconnection among the plurality of integrated circuit blocks or the cells within the same block.

These drawbacks are exemplified in FIG. 3, in that the wiring is relatively long within the block layout connecting from an inside terminal to a relay terminal in the edge portion, that is caused by bypassing other connections within the block (A1–A1' or B1–B1' of FIG. 3).

In addition, since the terminals for the inter-block connections are rather concentrated in the edge portion of the block, the wire length for the inter-block connection may become unduly large as exemplified by the connection A1–B1 of FIG. 3 This may be contrasted by a shorter connection C1–D1 illustrating a more suitable case of the interconnection.

The difference in the above noted wiring length may give rise to several effects such as, for example, skews induced by clock signals having an opposing phase, which may cause a circuit malfunction in the block.

The long wiring tends to result in another disadvantage such as a considerable wiring delay caused by coupling or crosstalk. In addition, the long wiring is unfavorable not only in cost (from chip area consideration) but also in reduced device characteristics.

As a method for achieving high speed circuitry with the long wiring, the wiring may be formed with wider metal to reduce resistance. This is exemplified by the wiring A1–B1 of FIG. 6 formed with the upper 4th metal across the block area, that is more advantageous than the wiring formed in the bottom layer because of its shorter distance.

However, the thus formed wiring still has an undue length resulted from the connection with the terminals placed in the edge portion (A1–A1' or B1–B1' of FIG. 6) generally formed in the previous wiring method.

Also in the above described method for achieving high speed circuitry with the long wiring having a wider metal, the method of tapering is generally adapted for forming the connection from the wiring to a cell terminal in the block (which will be detailed later in reference to FIG. 27) to reduce the resistance as much as possible. This is achieved with a wiring changing its width in steps.

However, this method is not completely satisfying since it may cause an undue wiring delay resulting from the step-wise change in the width or additional wiring possibly needed for detouring connection.

In addition, a buffer is placed in the middle of a long connecting wire, and generally in the channel region between the blocks. When the buffer is formed distant from a terminal, the wiring which interconnects the buffer and the terminal and which is to be buffered, may become unduly long (FIG. 21).

Further, the long wiring may result the antenna effect which is known as a mode of destroying a gate (gate oxide), caused by the electric charge accumulated in a connecting wire during manufacturing process when the gate is connected to a conductor (or connecting wire) having a area larger than that of the gate.

In order to alleviate this failure mode, several measures are taken in previous methods such as incorporating an input protection diode in each standard cell, or carrying out the designing so as to meet the antenna rule by means of software control with autoplacement and routing tool.

These measures are not completely satisfying, since the size of the standard cell increases when the input protection diode is incorporated, which may increase the device cost. Also, in the above mentioned method of autoplacement and routing tool, the control becomes more difficult in automatic switching steps from one wiring layer to another during the designing.

SUMMARY

Accordingly, it is an object of the present disclosure to provide improved semiconductor integrated circuit device and method for fabricating such device, having most, if not all, of the advantages and features of similar employed devices and methods, while eliminating many of their disadvantages.

It is another object of the present disclosure to provide a semiconductor integrated circuit device fabricated with reduced size and wire connections, to thereby be able to alleviate wiring delay.

It is still another object the present disclosure to provide an improved placement and routing method of the building-block type for use in deep-submicron processes for fabricating the semiconductor device.

The following brief description is a synopsis of only selected features and attributes of the present disclosure. A more complete description thereof is found below in the section entitled "Description of Preferred Embodiments"

The semiconductor integrated circuit device includes at least a plurality of integrated circuit blocks to be interconnected by wiring. The integrated circuit blocks are each provided with a plurality of terminal cells each including a terminal target metal that is different from, and formed in a layer higher at least by one layer than, ordinary target metals originally included in a block netlist. In addition, the terminal target metal is formed of an upper metal for use in interconnecting the integrated circuit blocks.

According to another aspect, the semiconductor integrated circuit device alternatively includes at least a plurality of integrated circuit blocks to be interconnected by wiring, a plurality of block terminals provided in circumferential edge portions of a block layout, and a terminal cell provided inside of the block layout for use in connecting with a terminal in the integrated circuit block, in which the at least one terminal cell includes a terminal target metal that is different from, and formed in a layer higher at least by one layer than, ordinary target metals originally included in a block netlist. In addition, the interconnection among the integrated circuit blocks is carried out by way of the block terminals provided in circumferential edge portions of a block layout and the terminal targets of the terminal cell.

According to still another aspect, the semiconductor integrated circuit device may alternatively include a plurality of integrated circuit blocks to be interconnected by wiring, a plurality of block terminals provided in circumferential edge portions of a block layout, and a plurality of terminal cells each provided inside of the block layout for use in connecting with a terminal in the integrated circuit block, in which at least one of the terminal cells each includes a terminal target metal that is different from, and formed in a layer higher at least by one layer than, ordinary target metals originally included in the block netlist.

In addition, a metal provided as a target by the terminal cells is formed including a plurality of cells which have a structure of any one of single layered and multi-layered and which include the target metal different from each other. Further, the interconnection among the integrated circuit blocks is carried out by preferentially placing the terminal cell according to the direction of wiring connection with the integrated circuit block and to the preferential wiring direction and by interconnecting the integrated circuit blocks by way of the block terminals provided in circumferential edge portions on the block layout and the terminal targets of the terminal cells.

In these semiconductor integrated circuit devices, at least one of the terminal cells may each be formed to additionally include a capacitor, a buffer, a diode, a power and ground strap, or a cell function device. In addition, at least one of the terminal cells may each be formed independent of any one of input and output terminals of the buffer device to be connected with the terminal for interconnecting the integrated circuit blocks, having the width larger than the pitch, and of the height larger than that, of terminals of a plurality of the cell function devices.

According to another aspect, a method is disclosed for placement and routing of the semiconductor integrated circuit devices, including the steps of tabulating a block netlist, forming a plurality of terminal cells each including a terminal target metal that is different from, and formed in a layer higher at least by one layer than, ordinary target metals originally included in the block netlist, adding the terminal cell to an input/output terminal included in the block netlist, to be subsequently adopted newly as a block terminal, obtaining the coordinates of the terminal cells from a layout obtained through autoplacement and routing steps, forming a layout including only the terminal cells, providing block terminals in circumferential edge portions on the block layout by laying out the layout thereonto, forming a block layout for a terminal target provided in the integrated circuit block with each of the terminal cells as a termination, and interconnecting the integrated circuit blocks by way of the block terminals provided in circumferential edge portions on a block layout and the terminal targets of the terminal cells.

The present disclosure and features and advantages thereof will be more readily apparent from the following detailed description and appended claims when taken with drawings.

BRIEF DESCRIPTION OF THE DRAWINGS

In the following drawings, like references numerals will be used to refer to like elements in the various drawings, in which:

FIG. 7A is a top view illustrating the terminal cell provided with one terminal disclosed herein;

FIG. 7B is a top view illustrating the terminal cell provided with two terminals disclosed herein;

DESCRIPTION OF THE PREFERRED EMBODIMENTS

In the detailed description which follows, specific embodiments on semiconductor integrated circuit devices and the methods for placement and routing particularly useful in fabricating such devices are described. It is understood, however, that the present disclosure is not limited to these embodiments. For example, it is appreciated that the methods disclosed herein may also be adaptable to any form of electronic circuitry. Other embodiments will be apparent to those skilled in the art upon reading the following description.

Figure 1:
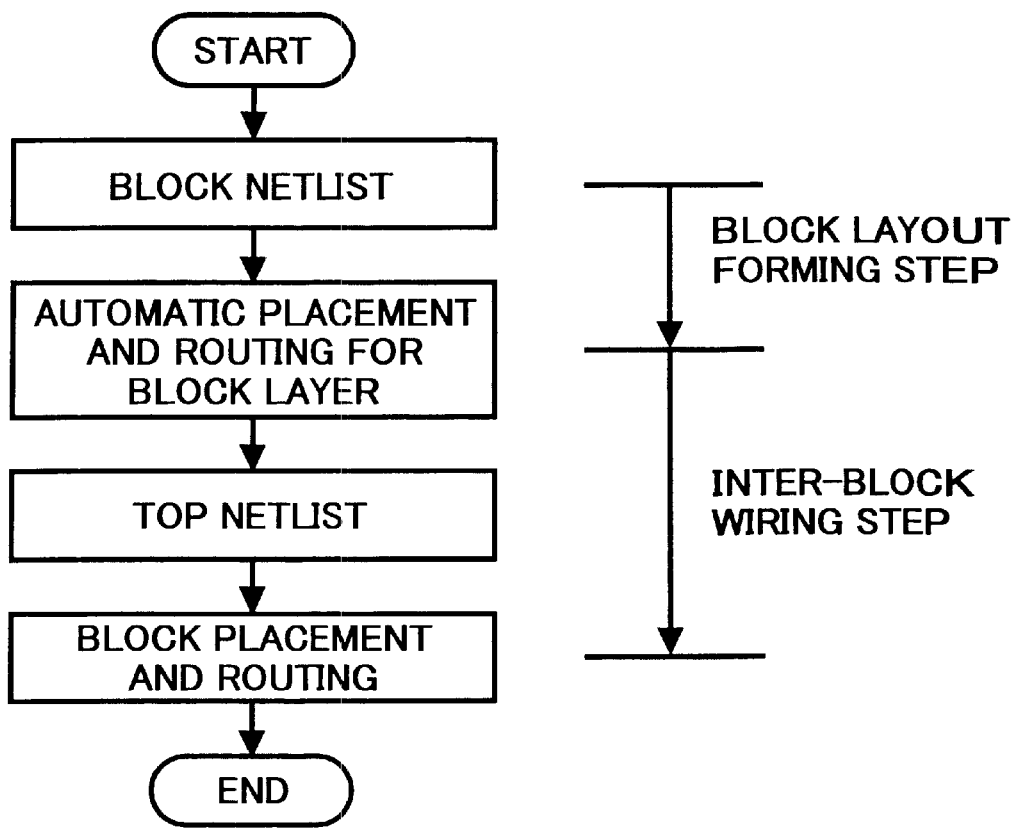
FIG. 1 includes a flow chart illustrating a basic process flow in the building-block method for designing a block layout.
Figure 2:
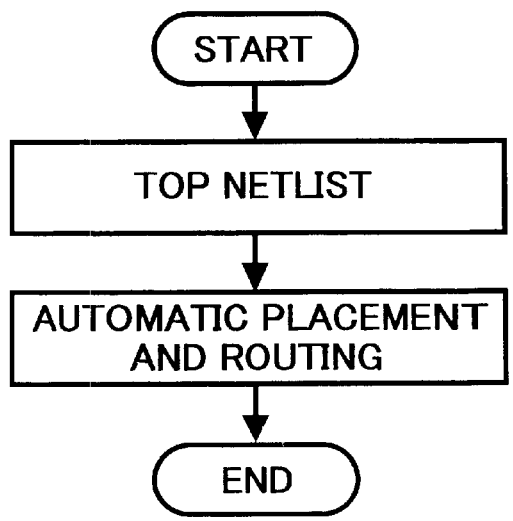
FIG. 2 includes a flow chart illustrating a basic process flow in the flat layout method for designing a block layout.
Figure 3:
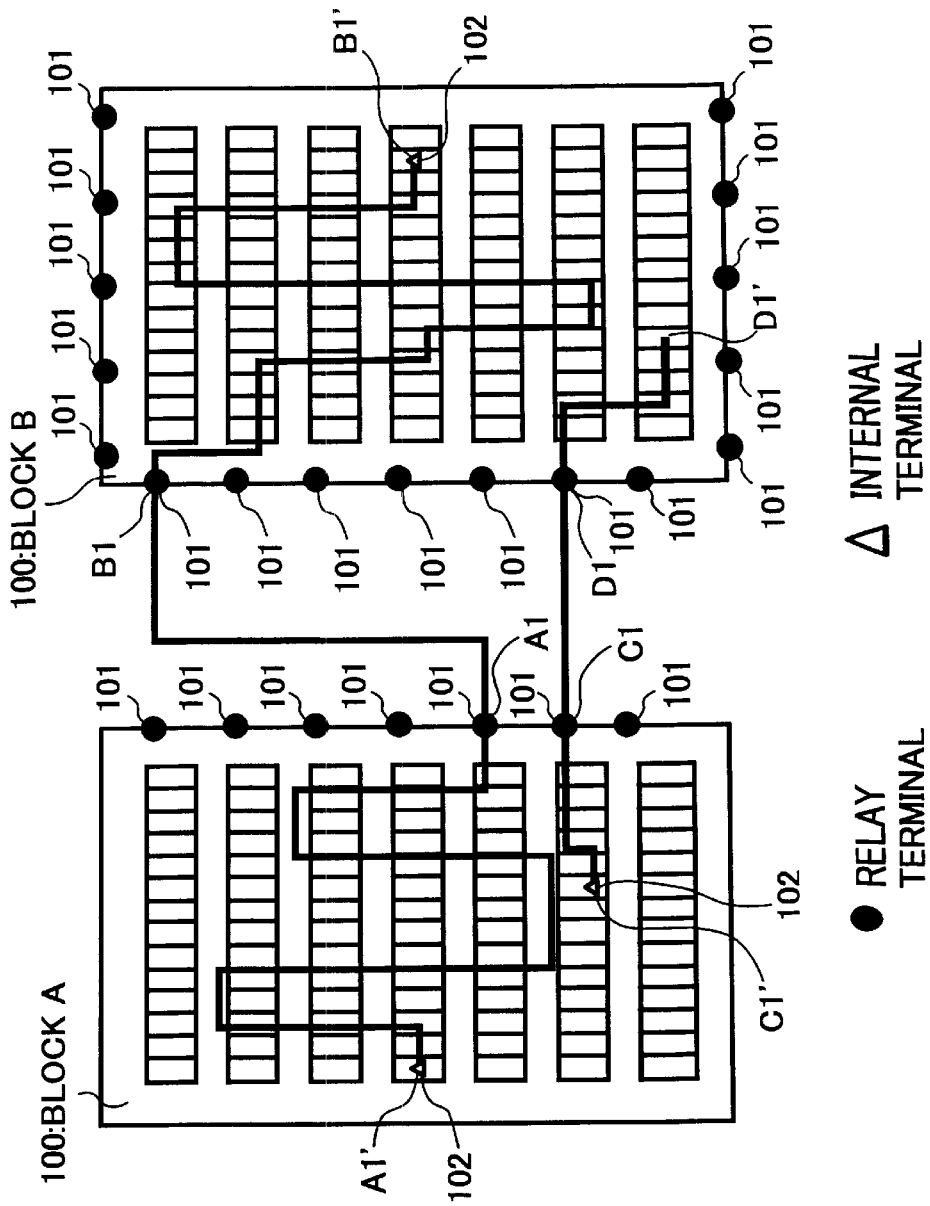
FIG. 3 is a block diagram illustrating the block layout formed by a previous building-block method.
Figure 4:
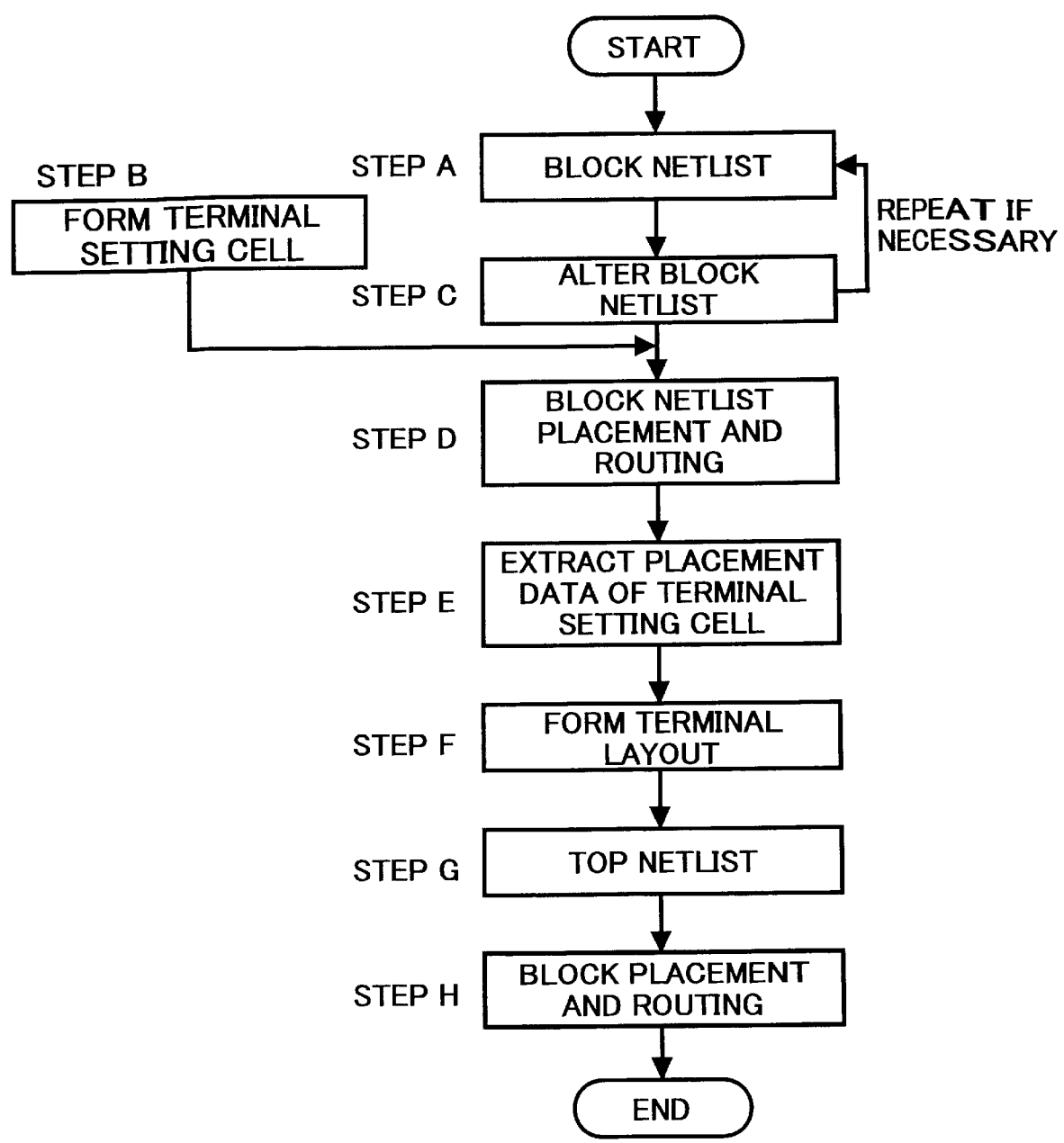
FIG. 4 includes a flow chart illustrating a process flow in the placement and routing method for semiconductor integrated circuit devices disclosed herein.
Figure 5:
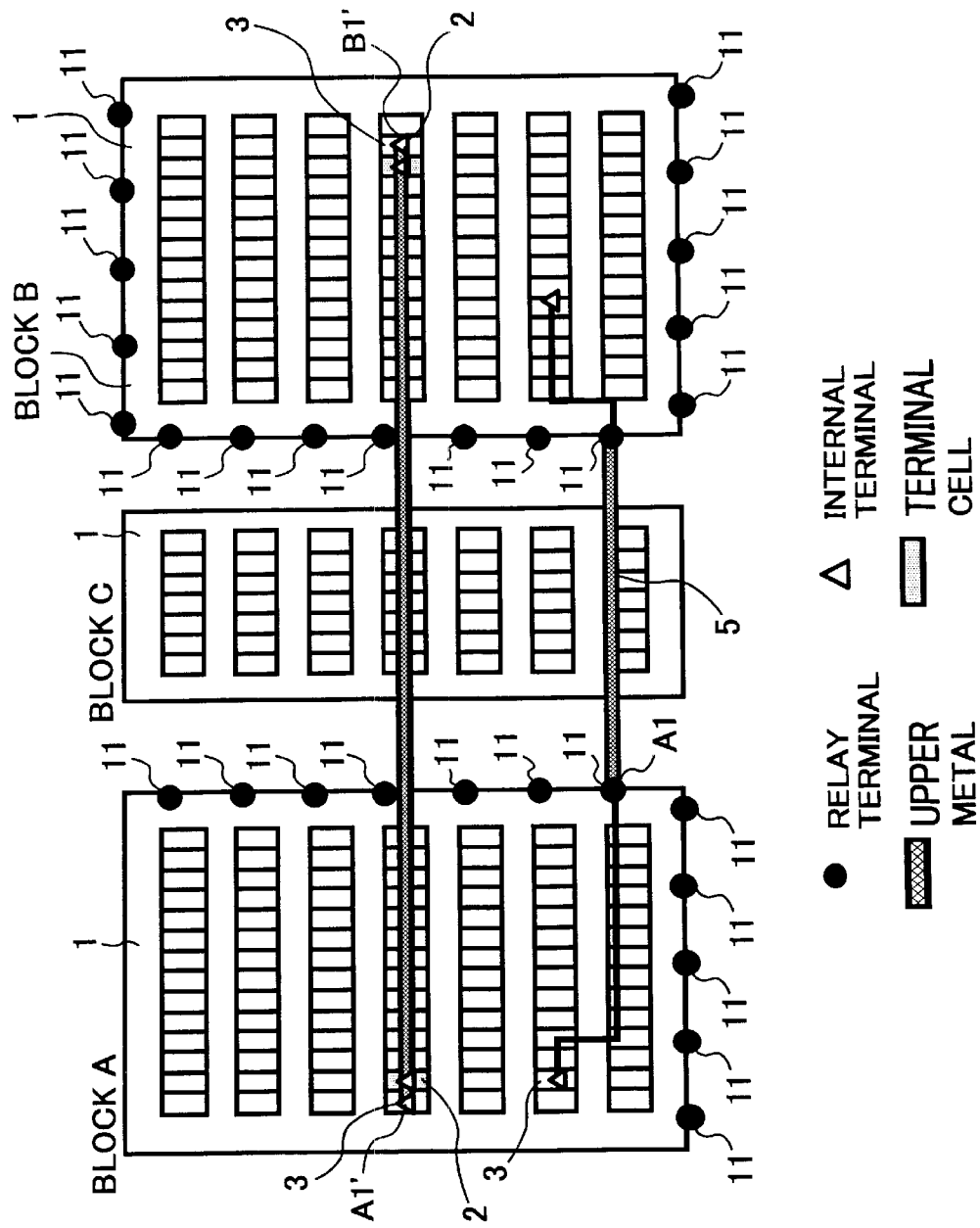
FIG. 5 is a block diagram illustrating the block layout of the semiconductor integrated circuit device according to one embodiment disclosed herein.

FIG. 4 includes a flow chart illustrating process steps in the placement and routing method for semiconductor integrated circuit devices according to one embodiment disclosed herein, and FIG. 5 is a top view illustrating the semiconductor device formed by this method, in which the device is exemplified by its five-layered structure.

In forming a layout of the integrated circuit block utilizing the building-block method according to the present embodiment, several terminal cells are added to replace the terminals, which are originally included in the block netlist as input and output (I/O) terminals to connect the blocks. The terminal cells are then used for the connection, and the above-mentioned original terminals are deleted from the layout.

In contrast to the original terminals usually formed on a relatively lower layer in the structure (lower metal), as indicated above, the terminal cell 2 of FIG. 5 is provided having a terminal at the level of an upper layer (4th or 5th metal).

By subsequently providing automatic placement and routing steps, the block interconnection is carried out as shown in FIG. 5, in that the original block input terminal A1 (B1) is connected to the terminal cell 2 without reaching the circumferential edge portions of the block layout, and terminated within the block.

The subsequent steps then proceed utilizing the terminal cell 2 which is presently adopted as a terminal, and the block layout is completed.

The interconnection between the blocks are carried out by connecting a relay terminal 11 in the circumference area, which are defined by the block layout, with the terminal cell 2 provided inside the block.

When one input or output is connected with more than two terminals at the same time, a program is executed to achieve the weighing control onto the net.

Referring to the flow diagram of FIG. 4, the designing steps are detailed herein below.

A block netlist is formed in Step A, and a terminal cell 2 is subsequently formed in Step B to have a terminal in the vicinity of the upper metal. This terminal cell 2 is formed with metal in an upper layer (4th or 5th metal) generally for use in the interconnection between blocks.

After completing Step B, the process proceeds to Step C, where several terminal cells 2 are added in place of the terminals which are originally included as input or output terminals to interconnect the blocks in the block netlist, and the original terminals to be replaced by relaying through the thus prepared terminal cells 2 are deleted from the layout. These process steps are then repeated for the number of times necessary.

After finishing autoplacement of the cells in Step D, a further block layout though automatic routing steps is carried out utilizing the layers other than the above noted upper layers (4th or 5th metal), to thereby blocks A, B and C be formed as shown in FIG. 5.

Subsequently, the coordinates of the terminal cells 2 for use in terminal setting are obtained in Step E from the layout obtained through the autoplacement and routing steps, to thereby form a layout including only the terminal cells. This layout is then overlain on the block layout previously obtained by autoplacement and routing steps, to thereby complete the block diagram. These process steps are then repeated for the number of times of the layouts.

A TOP netlist is subsequently formed in Step G, the blocks previously formed in Step E are subjected to the placement followed by automatic routing steps in Step H, and then the whole process is completed.

By implementing the above noted designing steps, the interconnection between the block is achieved as shown in FIG. 5, in which a terminal cell 2 is added to the I/O terminal 3 (A1') in the block A, and another terminal cell 2 is similarly added to the I/O terminal 3 (B1') in the block B. These two terminal cells 2,2 are then interconnected by way of the upper metal 4 to have with the least in-between distance.

There also shown in FIG. 5 is another example of the interconnection, in which the routing is carried out such that the I/O terminal 3 in the block B is once connected to a relay terminal 11 in a similar manner to the previous connection, then further connected with an opposing relay terminal 11 in the block B by way of the upper metal 4.

Among the methods of routing, an appropriate method may be selected in practice depending on the situation of the type of the block construction. Namely, when overlying upper metal 4 and 5 are available in the block, and an undue increase in the wiring distance is foreseen for the previous method using the relay terminals, the presently disclosed method is appropriately adapted by wiring by way of the terminal cell 2 to achieve a minimum wiring distance. In contrast, when a shorter wiring distance is expected by the previous method of wiring, this can be selected instead.

Figure 6:
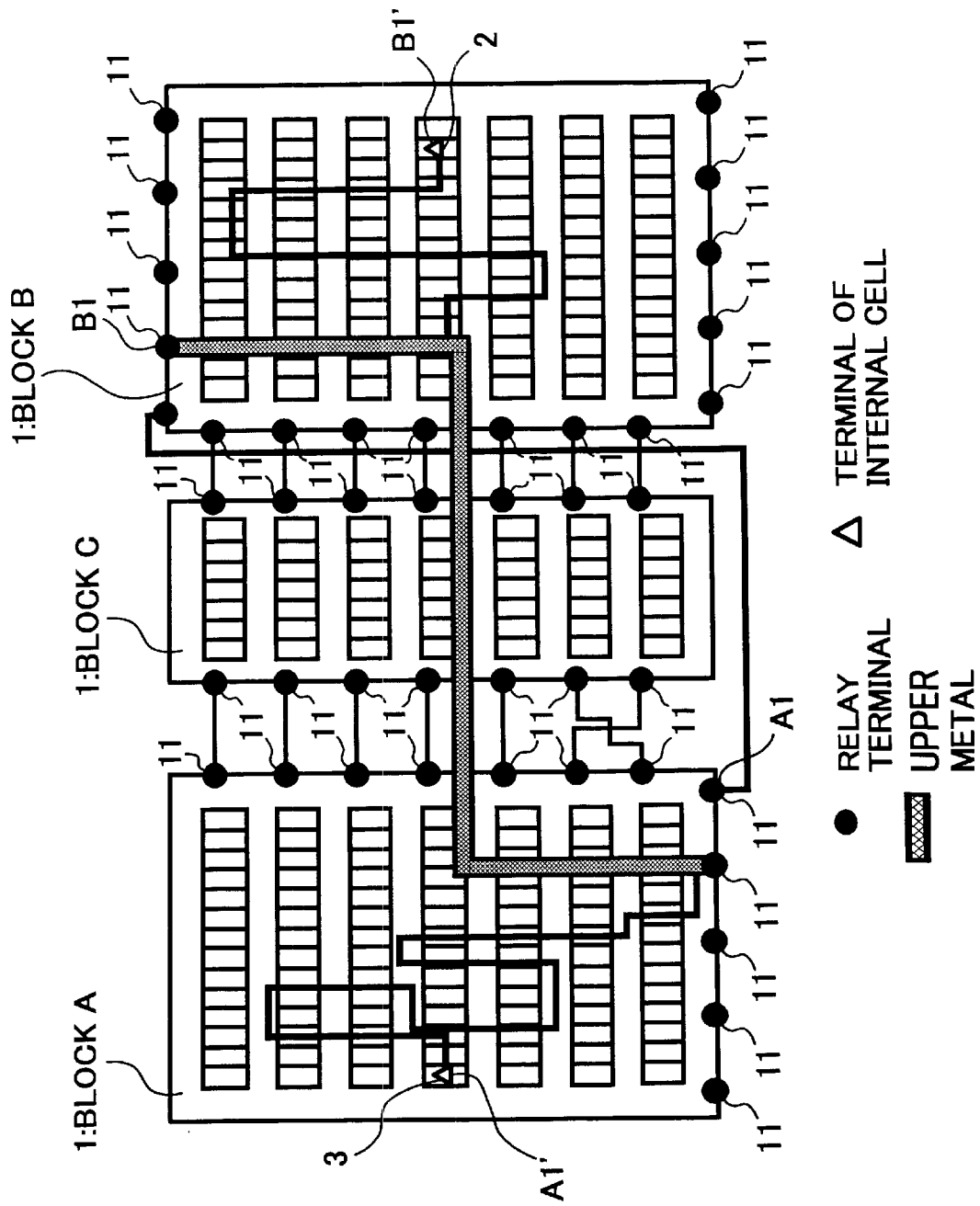
FIG. 6 is a block diagram illustrating the block layout corresponding to that of FIG. 5 formed by the previous building-block method.

A further illustration of the layout is shown in FIG. 6 with the connection which is achieved without using the terminal cell 2. Namely, the connection from the I/O terminal 3 to the relay terminal 11 of FIG. 6 is formed having an excessive length. This is caused by bypassing other connections within the block, to thereby result in drawbacks such as the signal delay, among others.

The distance therefore decreases for the aforementioned interconnection between A1' and B1' of FIG. 5 compared with that between A1' and A1, or B1' and B1, of FIG. 6. As a result, possible effects from resistance and crosstalk, and coupling capacitance decrease, to thereby be able to reduce wiring delay for the interconnection.

In the present method of layout, the terminals can be placed not only in the circumferential edge portion but over the area of the block. The degree of freedom therefore increases in the terminal placement for the block layout.

In addition, since unduly long wiring otherwise needed to connect with the terminals in the circumferential portion can be alleviated in the present layout, the wiring cost can therefore be reduced as well as the area in the block needed for the wiring.

Further, an improvement can also be achieved in the case of the terminal which is connected with two or more opposing terminals of standard cells in the block. The terminal can be placed at the midpoint from the opposing terminals so as to result in approximately equal wiring delay for respective connections with these terminals. As a result, an improved stability in circuit characteristics can be achieved.

FIGS. 7A and 7B are top views illustrating terminal cells 2 according to one the embodiment disclosed herein. Referring to FIGS. 7A and 7B, the terminal cells 2 are added to I/O terminals 3 in the block and exemplified in the present embodiment as those formed in the fourth metal in the five-layered metallized structure. A terminal 21 is formed herein to be connected with the 4th metal portion of the terminal cell 2. Also shown in FIGS. 7A and 7B are power lines 12 and ground lines 13, formed in the first metal. In addition, FIGS. 7A and 7B illustrate one terminal 21 and two terminals 21 a and 21 b, provided in the terminal cell, respectively.

Figure 8:
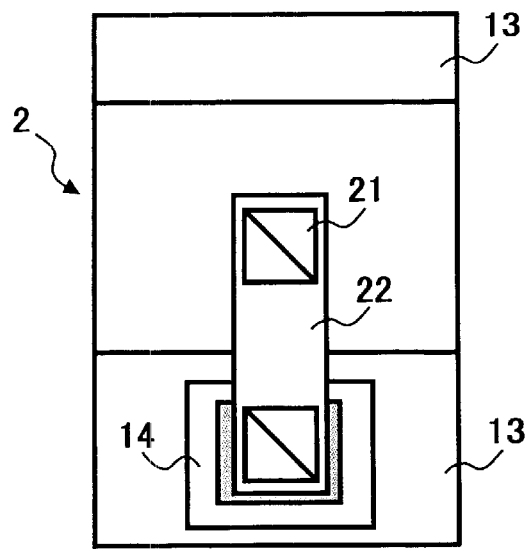
FIG. 8 is a top view illustrating the terminal cell incorporating a diode according to another embodiment disclosed herein.

The terminal cell 2 may also be formed in various other forms than those shown above in FIGS. 7A and 7B. As an example, the terminal cell 2 may be fabricated incorporating a diode as shown in FIG. 8, including a diffusion region 14 which is formed by the n+ ion implantation in a substrate of the p-conductivity type and then connected to a terminal metal 22. The terminal metal 22, in turn, is connected with the terminal cell 2 to thereby form the diode structure.

With the thus prepared diode structure, the antenna effect may decrease, which considerably affects in general to characteristics of the block circuitry, and the cost of device fabrication can be considerably reduced compared with the structure which is provided with input protection diodes formed in each standard cell.

Figure 9:
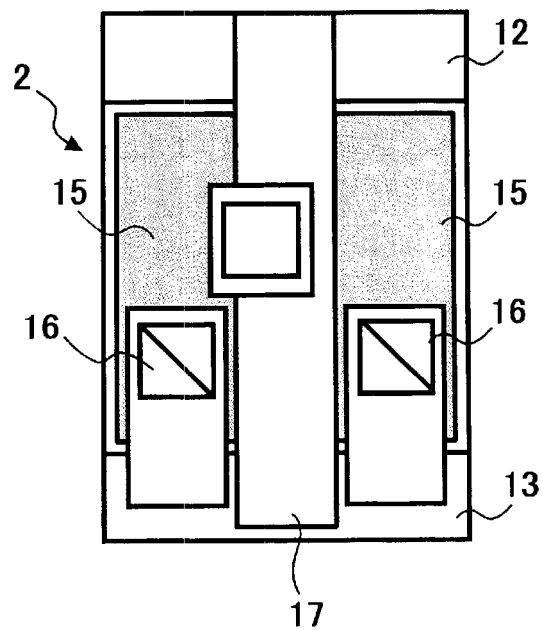
FIG. 9 is a top view illustrating the terminal cell incorporating a capacitor according to still another embodiment disclosed herein.

As another example, the terminal cell 2 is formed incorporating a capacitor as shown in FIG. 9, consisting of source and drain 15,15 short-circuited with metal 16,16 as one electrode, and gate 17 pulled up by connecting with power line 12 as the other electrode. In addition, the thus formed capacitor is non-connected with a terminal 21 of the terminal cell 2.

With the thus prepared terminal cell incorporating the capacitor, a coupling capacitance is appropriately provided, and this result in the formation of the block which is less affected by power source noises. Moreover, the terminal cell area is efficiently utilized with the present structure.

Figure 10:
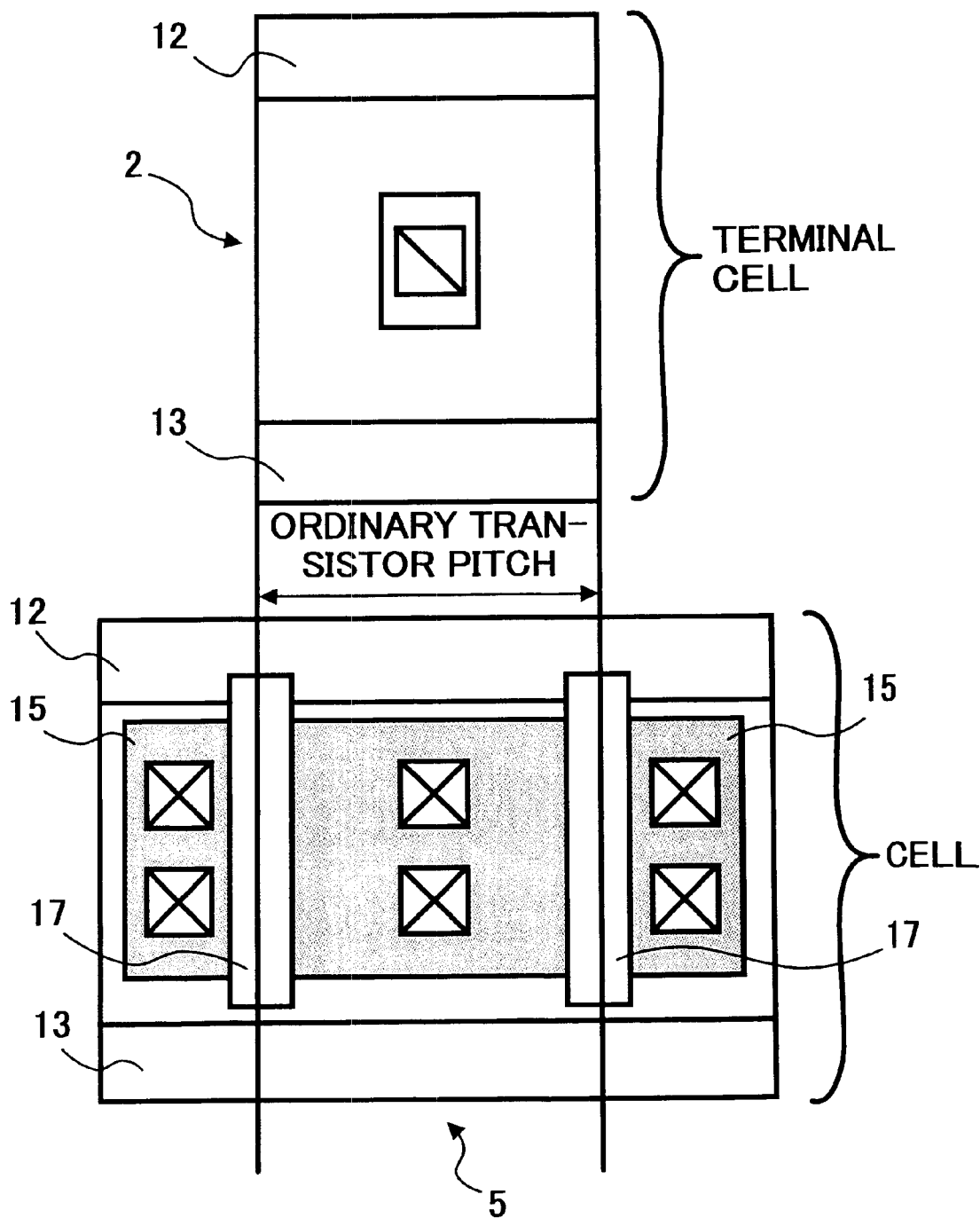
FIG. 10 is a top view illustrating the terminal cells and the placement thereof according to another embodiment disclosed herein.

FIG. 10 is a schematic diagram illustrating the placement of the terminal cell 2 and general functional cells 5 according to another embodiment disclosed herein.

Referring to FIG. 10, the terminal cell 2, which is shown in the top portion of the figure, is placed relative to the general functional cells 5 shown in the bottom portion. In the present example, the width of the terminal cell 2 is determined to be in coincident with the pitch of transistors in the functional cells, as the case often adopted in practice for usual wiring.

Figure 11A:
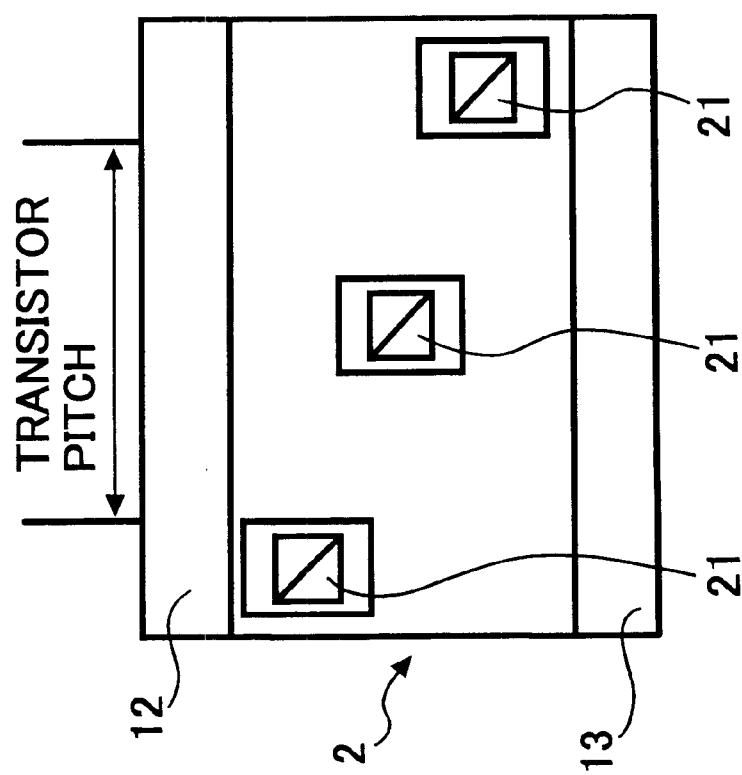
FIG. 11A is a top view illustrating a terminal and the arrangement thereof for the terminal cell according to another embodiment disclosed herein.
Figure 11B:
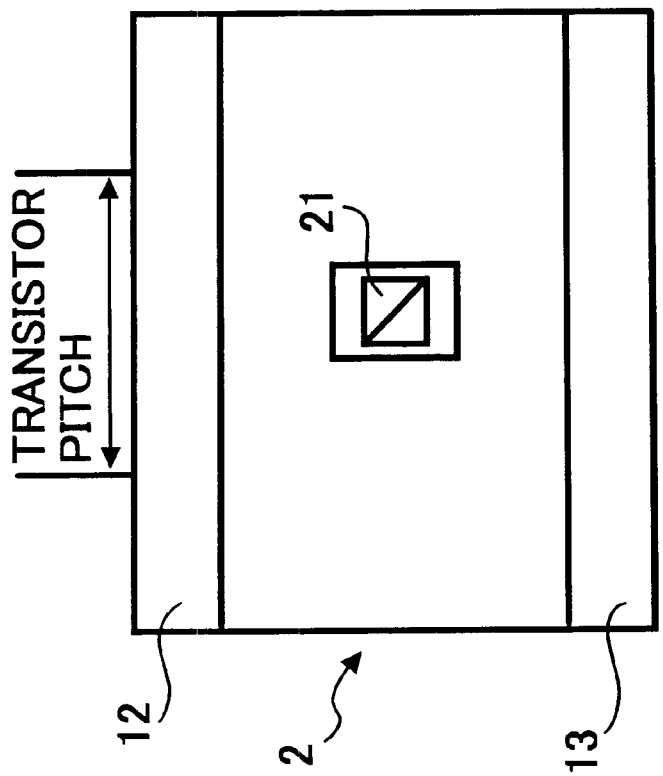
FIG. 11B is a top view illustrating three terminals and the arrangement thereof for the terminal cell corresponding to that of FIG. 11A.

When a connecting wire with a relatively large width is used to connect with the terminal cells, at least one of the cells may preferably be placed having a pitch larger than that of the wire. Namely, this is exemplified by the terminal cell 2 shown in FIG. 11A or 11B, which is placed having a pitch larger that of the terminal cell 2 of FIG. 10. Incidentally, FIGS. 11A and 11B illustrate one terminal and three terminals, provided in the terminal cell, respectively.

Figure 12:
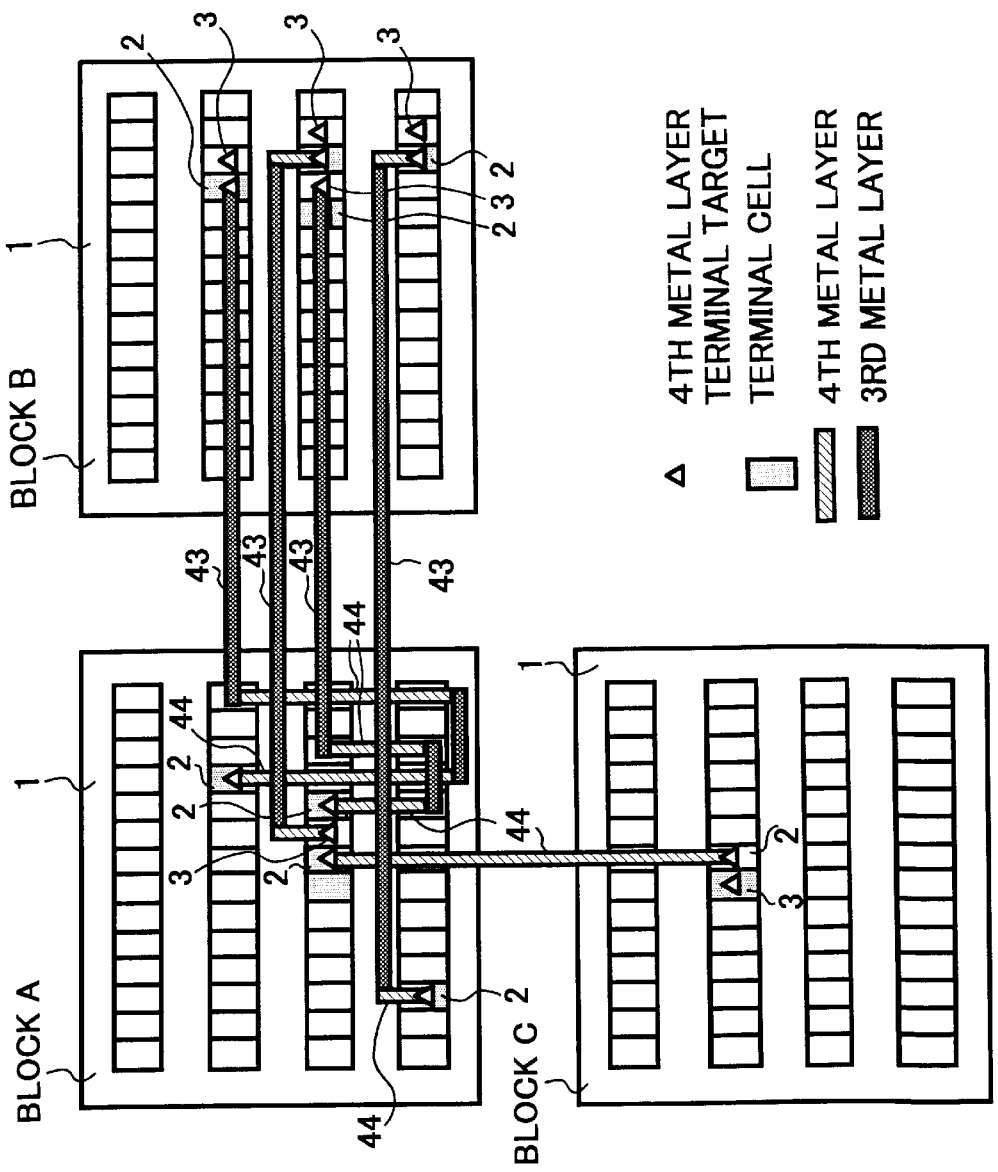
FIG. 12 is a block diagram illustrating the block layout of the semiconductor integrated circuit device according to another embodiment disclosed herein.

There described so far has been the terminal cell 2 having a single metal target. This terminal cell 2, however, has disadvantages in some instances such as unnecessarily long wiring caused by the preferential wiring direction of an automatic placement tool, for example. This is the case of the interconnection between the blocks A and B, as shown in FIG. 12, in which the unnecessary wiring is caused by the preferential wiring direction of the automatic placement tool, even after using both 4th metal 44 and 3rd metal 43.

Figure 13:
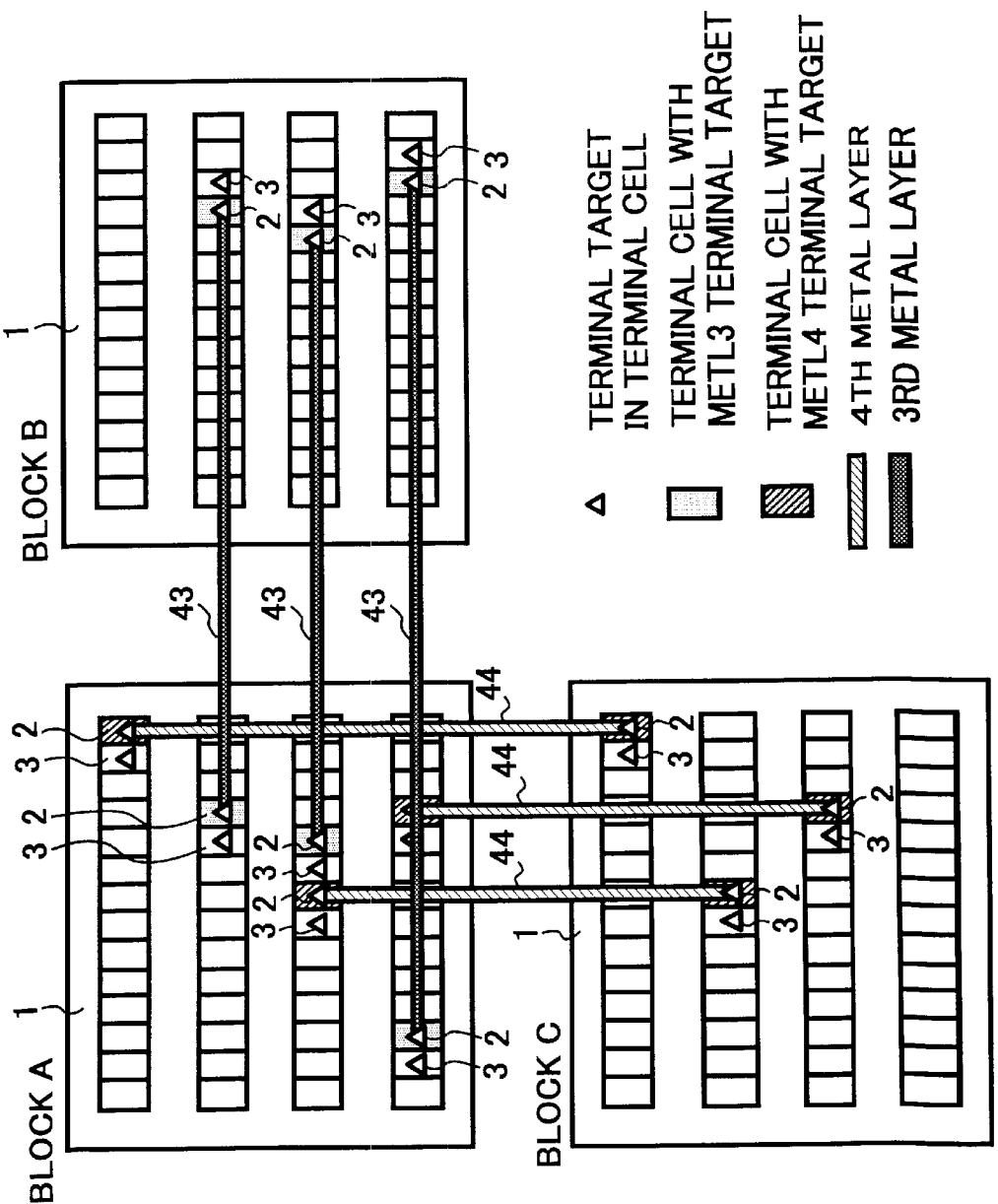
FIG. 13 is a block diagram illustrating the block layout improved from layout of FIG. 12.

To alleviate this difficulty, a further terminal cell 2 is provided, which is formed under the consideration of the preferential wiring direction. As shown in FIG. 13, this is achieved by forming terminal cells 2 provided with terminal metals each having different preferential directions.

Referring again to FIG. 13, the terminal cells 2 are each provided with at least two terminal metals, and appropriately placed taking the different preferential direction into consideration with respect to the preferential wiring direction of the automatic placement tool. For the present example in reference to FIG. 13, the preferential wiring directions of the automatic placement tool are vertical for the 4th metal and horizontal for 5th metal.

On deciding the preferential direction, terminals cells can subsequently be placed. That is, for the connections between the blocks A and B, terminal cells 2 having the 5th metal is placed, since its preferential direction is horizontal. In contrast, for the connections between the blocks A and C, terminal cells 2 having the 4th metal is placed, since the preferential direction is horizontal. As a result, the placement can therefore be confirmed and controlled with relative ease even at the level of floor plan.

With the present construction of the terminal cells and blocks, the interconnection can be achieved with linear wiring, to thereby facilitating the succeeding fabrication processes. In addition, the present structure and interconnection can be utilized in the damascene process with copper wiring.

Figure 14:
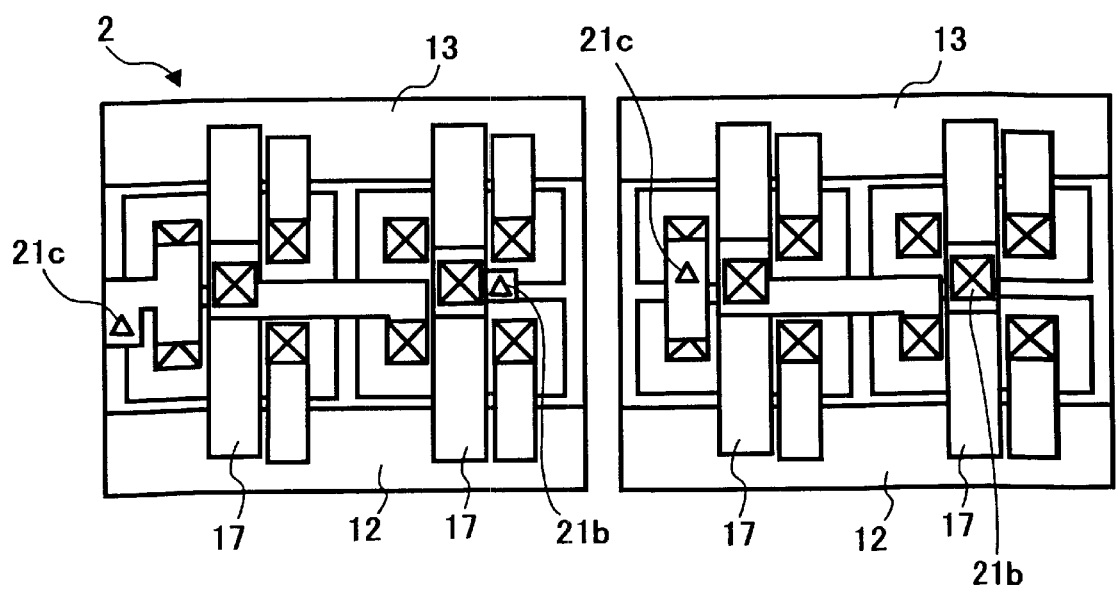
FIG. 14 is a top view illustrating the terminal cell incorporating a buffer according to another embodiment disclosed herein.
Figure 15:
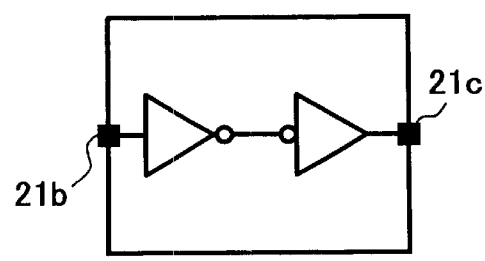
FIG. 15 is an equivalent circuit for the terminal cell of FIG. 14.

According to another embodiment disclosed herein, at least one of the terminal cells 2 may also be provided incorporating a buffer as illustrated in FIG. 14. FIG. 15 is the equivalent circuit for the diagram of FIG. 14, including an input terminal 21*b* and an output terminal 21*c*. These input and output terminals may also be used as the terminals for interconnecting the blocks.

Figure 16:
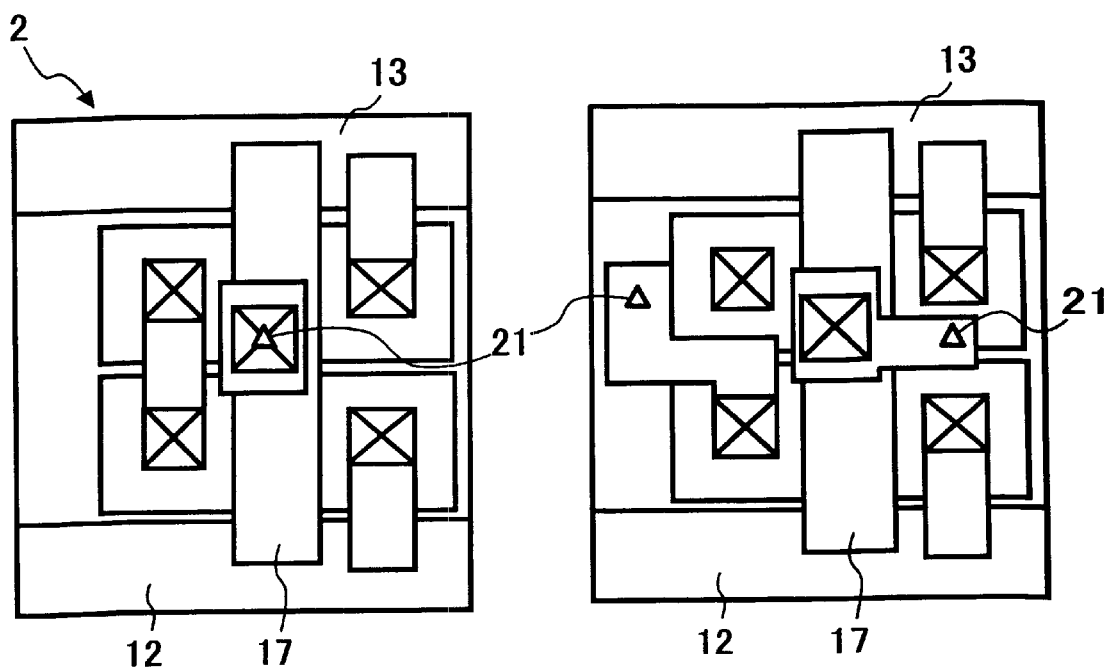
FIG. 16 is a top view illustrating the terminal cell incorporating an inverter according to another embodiment disclosed herein.
Figure 17:
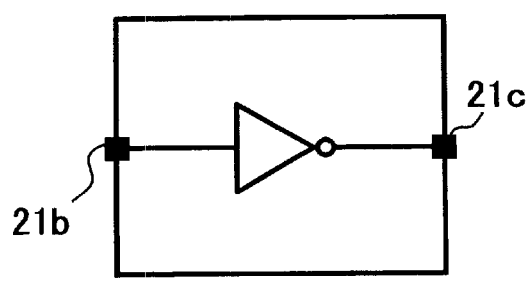
FIG. 17 is an equivalent circuit for the terminal cell of FIG. 16.

According to still another embodiment disclosed herein, at least one of the terminal cells 2 may also be provided to have the cell function, to thereby function also as a standard cell such as an inverter, for example, as illustrated in FIG. 14. In contrast to ordinary terminal cells, this cell therefore intrinsically has the capability of the functional cell, and also can be connected with a terminal of the block. FIG. 17 is the equivalent circuit for the diagram of FIG. 16.

In addition, one of the cells which is to be connected with the terminal may preferably be provided with a terminal target higher at least by one layer than the target. As a result, the terminal cell is therefore formed having the capability of the functional cell.

Figure 18:
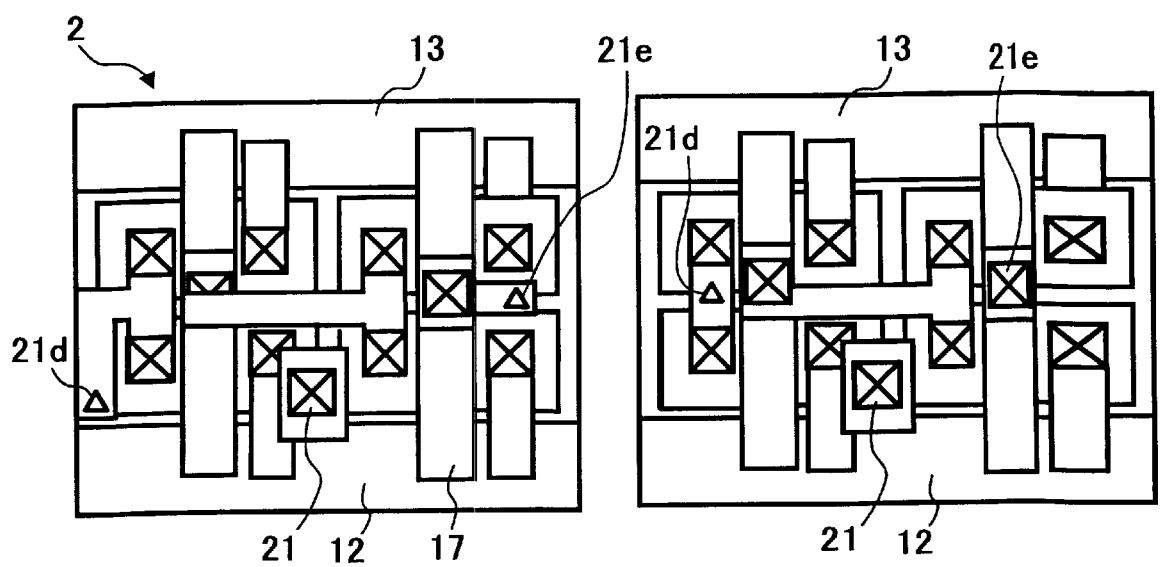
FIG. 18 is a top view illustrating the terminal cell with a buffer placed in-between the blocks according to another embodiment disclosed herein.
Figure 19:
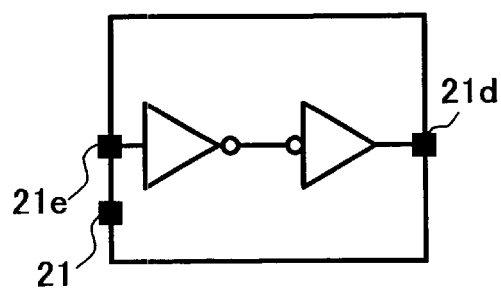
FIG. 19 is an equivalent circuit for the terminal cell of FIG. 18.

According to another embodiment disclosed herein, the terminal cell 2 may also be provided as a buffer placed in-between the blocks as shown in FIG. 18, which has input and output terminals independent of the terminals for the block layout, to be connected with the terminals for interconnecting the blocks. This buffer can therefore be used independently of the block terminals. The buffer includes an output terminal 21*d* and input terminal 21*e*. FIG. 19 is the equivalent circuit for the diagram of FIG. 18.

Figure 20:
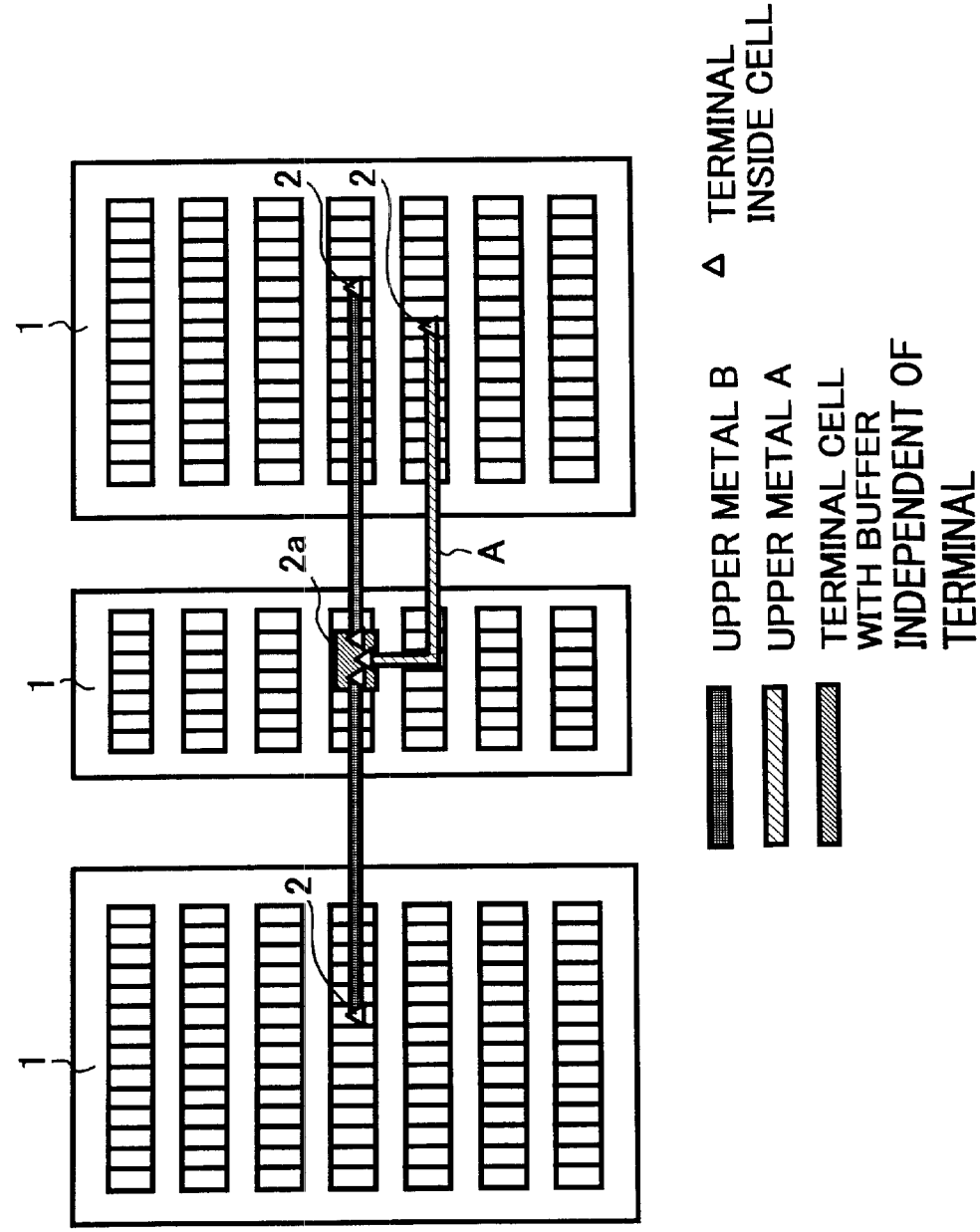
FIG. 20 is a block diagram illustrating the block layout of the semiconductor integrated circuit device incorporating a buffer according to another embodiment disclosed herein.

FIG. 20 is a block diagram illustrating a circuit layout including the terminal cell (2*a*) of FIG. 18. Referring to FIG. 20, the connecting line A leads to the terminal cell 2*a* via the buffer which is previously formed independently of the terminal cell. The line A is non-connected with the line B. With the present construction, the buffer can be placed effectively in the block. The buffer may alternatively be provided outside the block as shown in FIG. 21.

Figure 21:
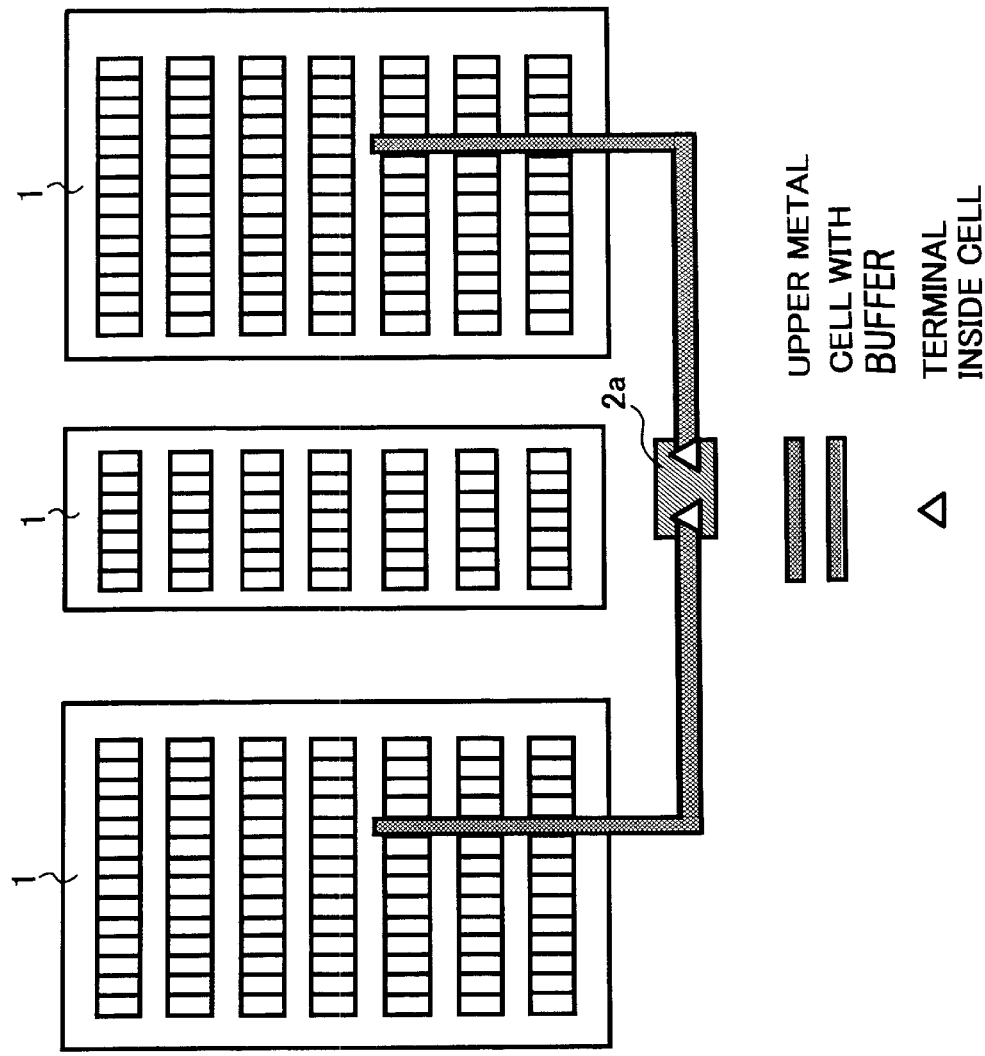
FIG. 21 is a block diagram illustrating the block layout corresponding to the layout of FIG. 20 formed by a previous method of interconnection.

The interconnection can be made shorter with the connection illustrated in FIG. 20 compared with the outside placement shown in FIG. 21. Therefore, the mode of buffer placement and interconnection is appropriately determined in practice depending on the overall block structure.

With the thus provided terminal cell incorporating the buffer, the inter-block connection, which is formed relatively long in general, can be adequately buffered, to thereby appropriately be utilized in high speed operations. In addition, since the buffer is formed independent of the terminal, buffering can be achieved also independent of the connection with the terminal cell.

Figure 22:
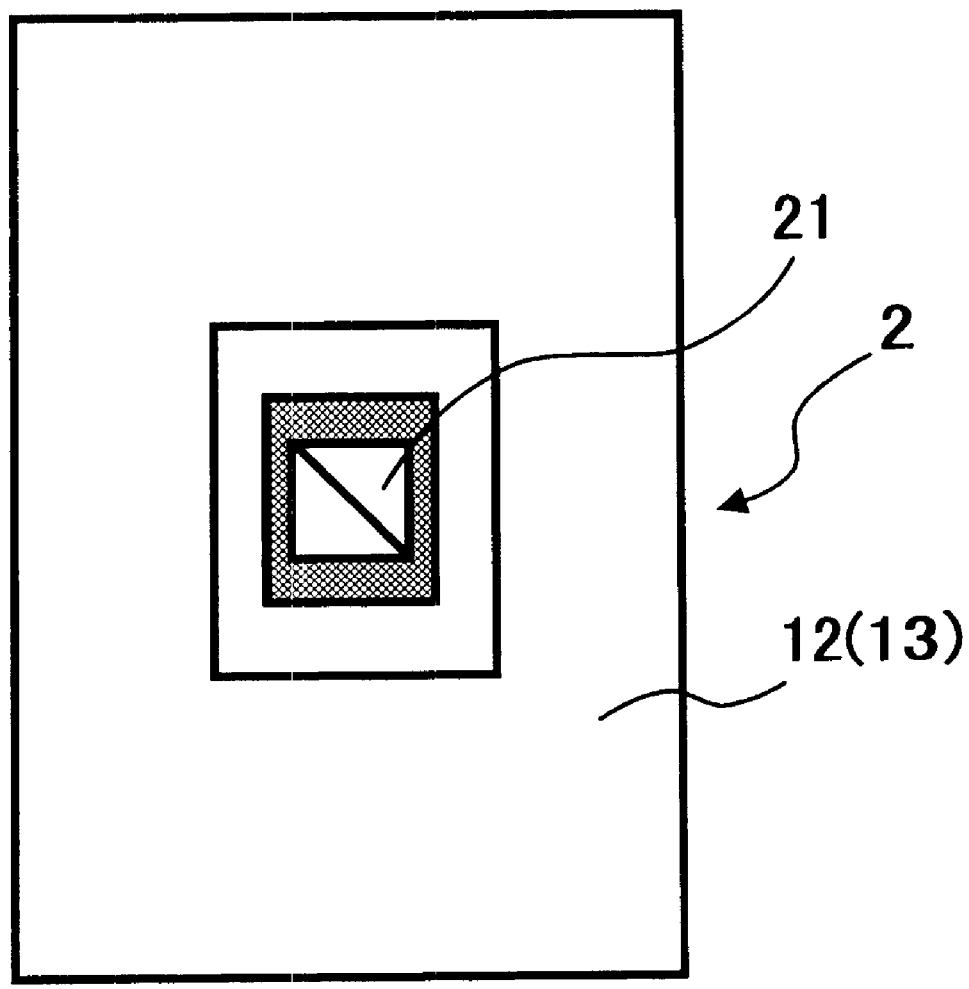
FIG. 22 is a top view illustrating the terminal cell incorporating power and ground straps according to another embodiment disclosed herein.
Figure 23:
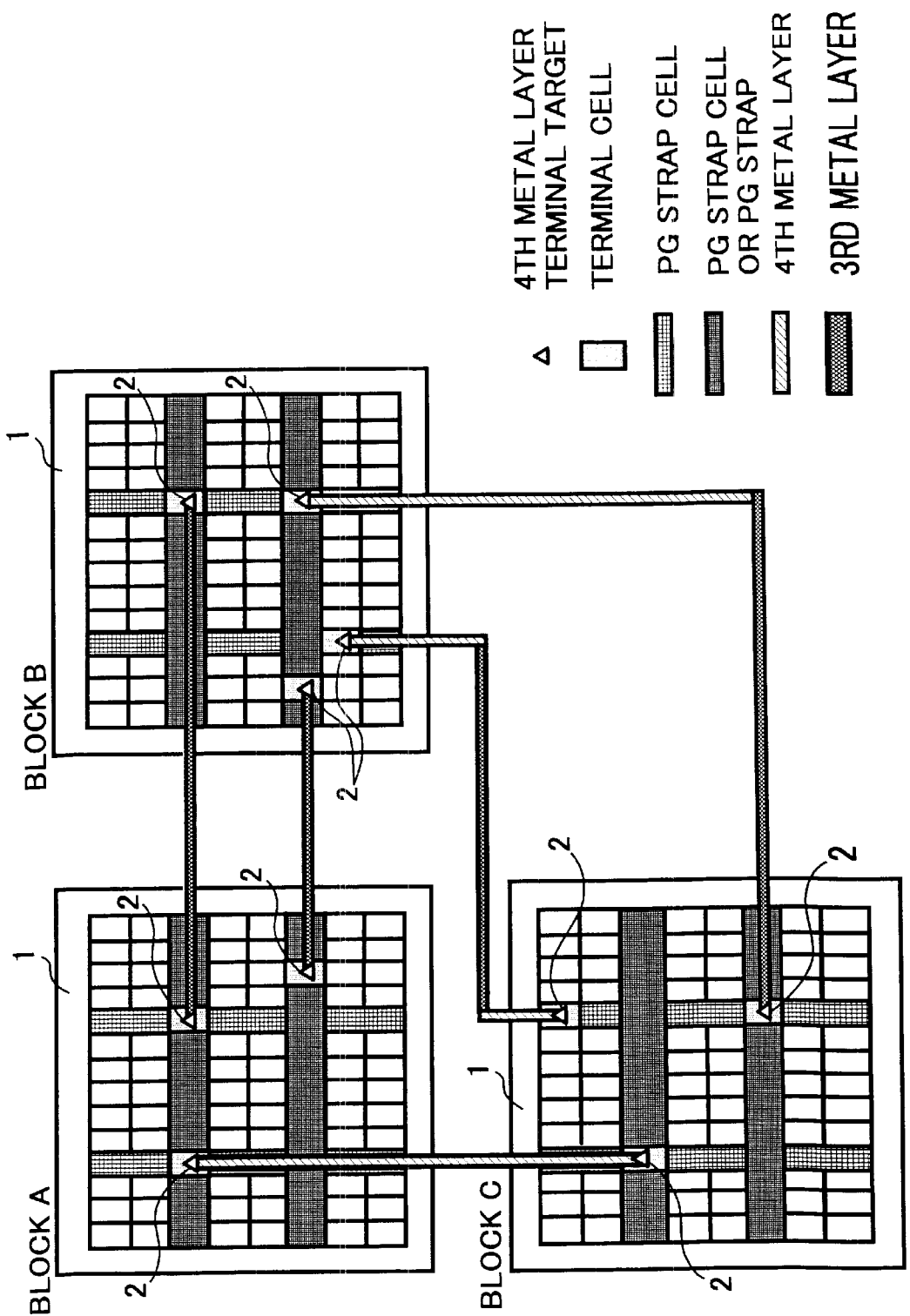
FIG. 23 is a block diagram illustrating the block layout of the semiconductor integrated circuit device incorporating power ground strap cells according to another embodiment disclosed herein.

According to still another embodiment disclosed herein, at least one of the terminal cells 2 may also be provided including power ground (PG) straps as illustrated in FIG. 22. The block structure including this PG strap cell is illustrated in FIG. 23. By placing the terminal cell at an intersecting point of the PG straps, improved circuit characteristics can be achieved. Further, by carrying out the row-column control and block layout design of the blocks A, B and C, and taking the inter-block connections into consideration, efficient inter-block connections can be achieved on top of the exiting PG straps.

Figure 24:
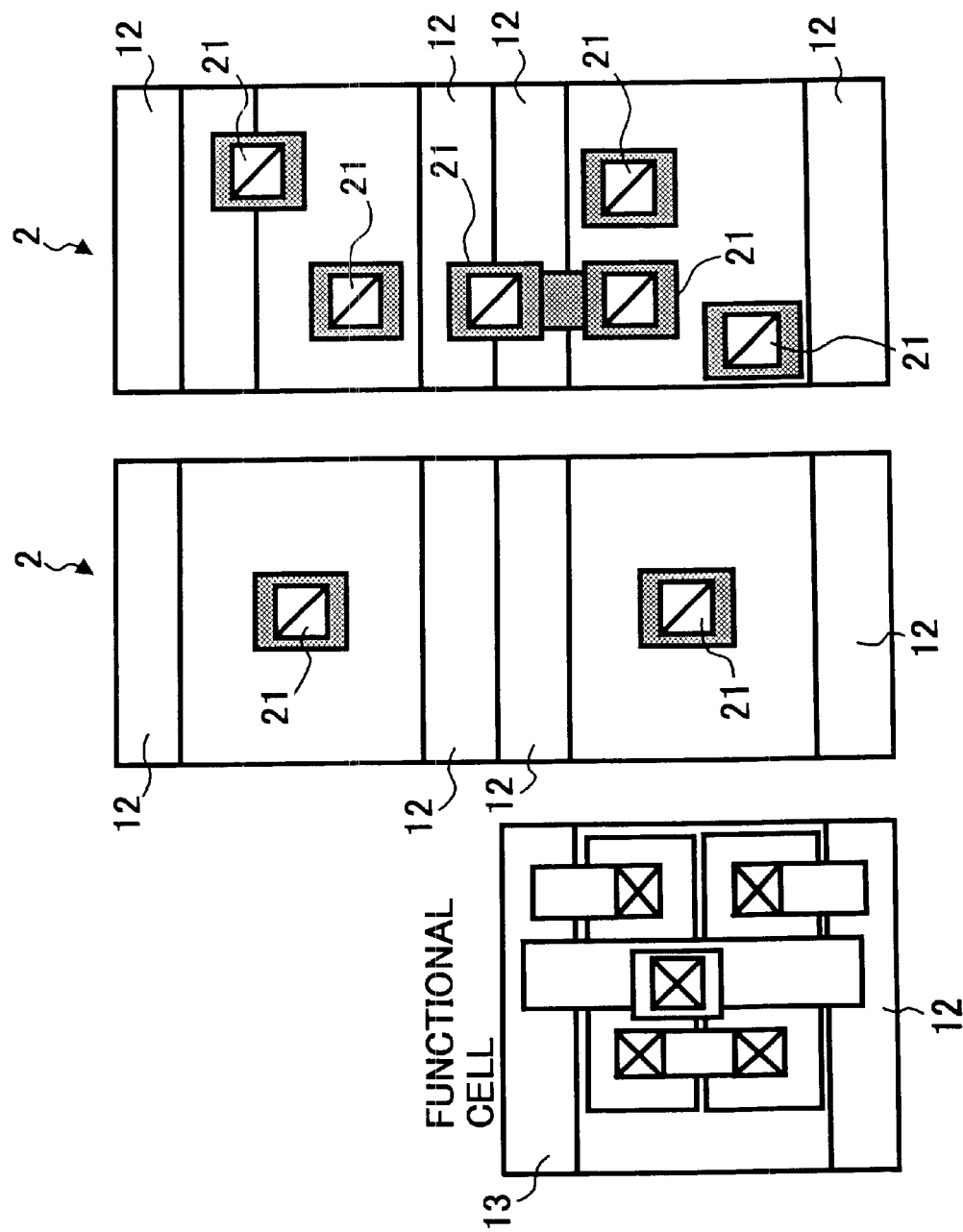
FIG. 24 a top view illustrating the terminal cells according to another embodiment disclosed herein.
Figure 25:
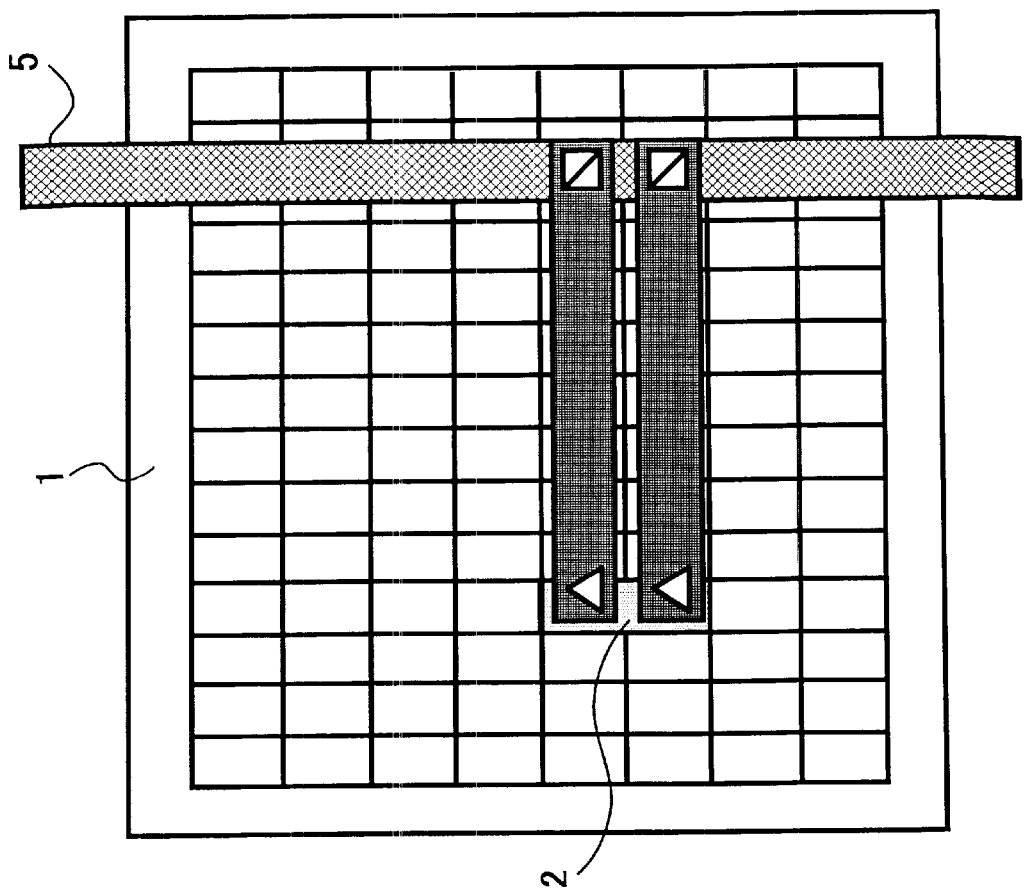
FIG. 25 is a block diagram illustrating the block layout of the semiconductor integrated circuit device incorporating terminal cells of FIG. 24 according to another embodiment disclosed herein.

According to another embodiment disclosed herein, at least one of the terminal cells 2 may be provided having the height larger than that of the functional cell as illustrated in FIG. 24. The block structure including this terminal cell is illustrated in FIG. 25, including an inter-block connection 5.

Figure 26:
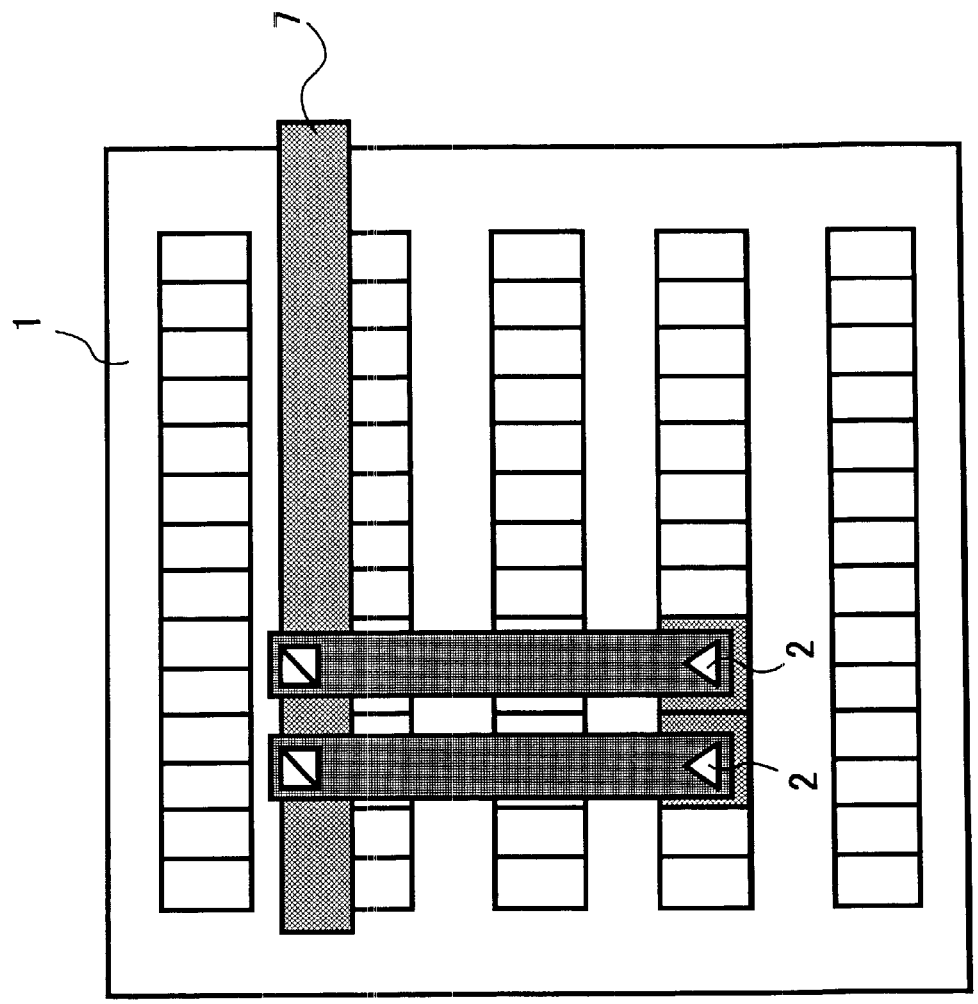
FIG. 26 is a block diagram illustrating the block layout of the semiconductor integrated circuit device incorporating a tapering structure according to another embodiment disclosed herein.
Figure 27:
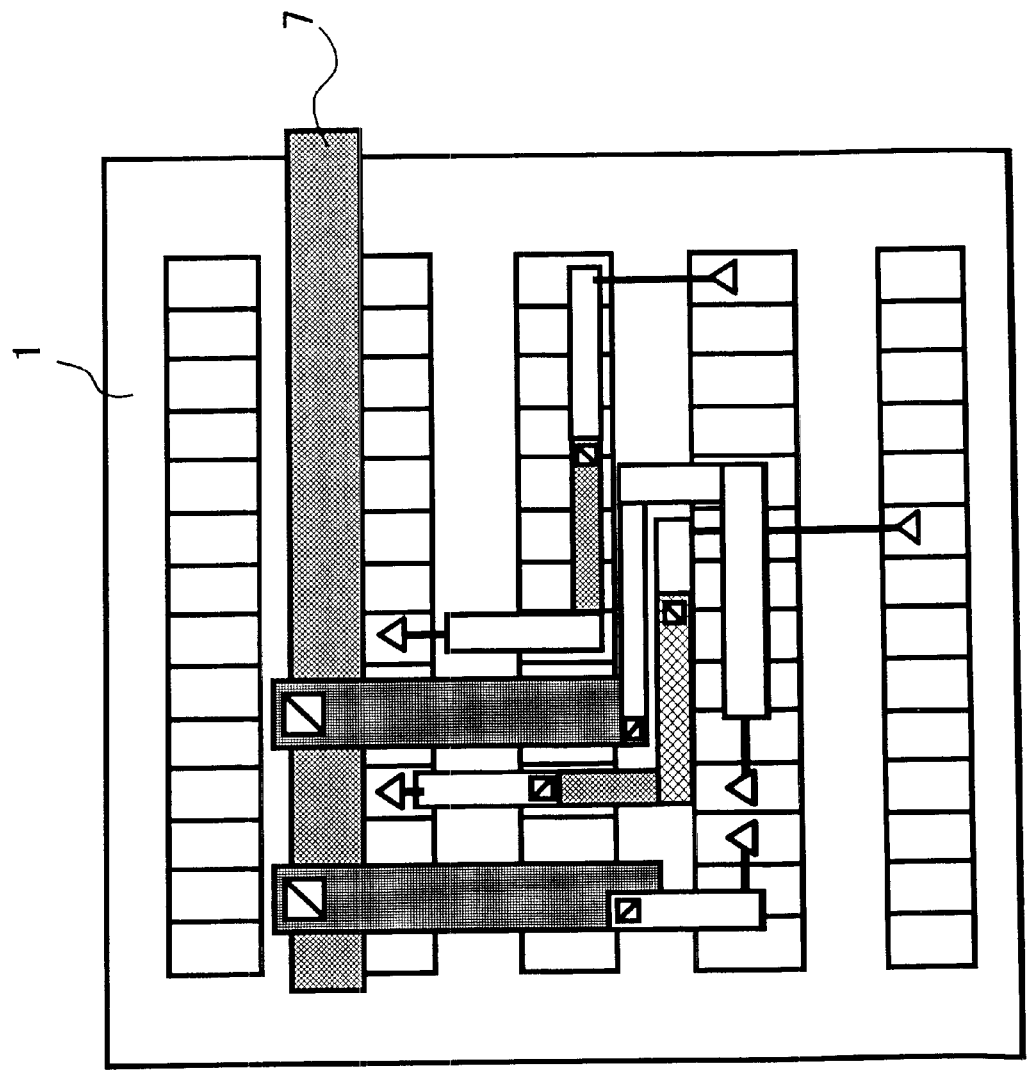
FIG. 27 is a block diagram illustrating the block layout of the semiconductor integrated circuit device with a tapering structure according to a previous method.

The present construction may also be adapted to the layout with the tapering structure as illustrated in FIG. 26 including a tapering element 7. The width of this terminal cell 2 is formed lager than the pitch of the cell in the block. Another tapering structure is shown in FIG. 27 to exemplify a contrasting example without the present tapering structure. Therefore, the wiring is simplified and the distance of the wiring can considerably be reduced with the present structure including the tapering.

The device fabrication and process steps set forth in the present description may be implemented using a conventional general purpose processor programmed according to the teachings disclosed herein, as will be appreciated to those skilled in the relevant arts.

Therefore, the present disclosure also includes a computer-based product which may be hosted on a storage medium and include instructions which can be used to program a processor to perform a process in accordance with the present disclosure. The storage medium can include, but is not limited to, any type of disk including floppy disks, optical disks, CD-ROMS, magneto-optical disks, ROMs, RAMs, EPROMs, EEPROMS, flash memory, magnetic or optical cards, or any type of media suitable for storing electronic instructions.

It is apparent from the above description including the examples, the semiconductor integrated circuit devices fabricated by the methods disclosed herein have several advantages over similar devices previously known, which are described earlier with several embodiments.

According to the present disclosure, therefore, semiconductor integrated circuit devices are fabricated effectively having advantages such as reduced size and wire connections, to thereby be able to alleviate wiring delay, among others. In addition, the present improved placement and routing method for fabricating integrated circuit devices may appropriately be utilized in deep-submicron device processes.

Additional modifications and variations of the present invention are possible in light of the above teachings. It is therefore to be understood that within the scope of the appended claims, the invention may be practiced otherwise than as specifically described herein.

This document claims priority and contains subject matter related to Japanese Patent Application No. 2000-278646, filed with the Japanese Patent Office on Sep. 13, 2000, the entire contents of which are hereby incorporated by reference.

What is claimed as new and desired to be secured by Letters Patent of the United States is:

1. A semiconductor integrated circuit device comprising:
a plurality of integrated circuit blocks, said integrated circuit blocks being interconnected by wiring,
wherein said integrated circuit blocks are each provided with a plurality of terminal cells each including a terminal target metal that is different from, and formed in a layer higher at least by one layer than, ordinary target metals originally included in a block netlist.

2. The semiconductor integrated circuit device according to claim 1,
wherein said terminal target metal is formed of an upper metal for use in interconnecting said integrated circuit blocks.

3. The semiconductor integrated circuit device according to claim 1,
wherein at least one of said terminal cells each includes a capacitor device.

4. The semiconductor integrated circuit device according to claim 1,
wherein at least one of said terminal cells each includes a buffer device, any one of input and output terminals of which is connected with a terminal target.

5. The semiconductor integrated circuit device according to claim 1,
wherein at least one of said terminal cells each is provided to have a cell function, connected with said target metal.

6. The semiconductor integrated circuit device according to claim 1,
wherein at least one of said terminal cells each is formed independent of any one of input and output terminals of said buffer device to be connected with said terminal for interconnecting said integrated circuit blocks.

7. The semiconductor integrated circuit device according to claim 1,
wherein at least one of said terminal cells each includes a power and ground strap.

8. The semiconductor integrated circuit device according to claim 1,
wherein at least one of said terminal cells each is formed having any one of a width larger than a pitch, and of a height larger than that of terminals of a plurality of functional cells.

9. The semiconductor integrated circuit device according to claim 1,
wherein at least one of said terminal cells each is provided therewithin with a diode device.

10. A semiconductor integrated circuit device comprising:
a plurality of integrated circuit blocks, said integrated circuit blocks being interconnected by wiring;
a plurality of block terminals provided in circumferential edge portions of a block layout; and
a plurality of terminal cells each provided inside of said block layout for use in connecting with a terminal in said integrated circuit block, said terminal cells each including a terminal target metal that is different from, and formed in a layer higher at least by one layer than, ordinary target metals originally included in a block netlist;
wherein
an interconnection among said integrated circuit blocks is carried out by way of said block terminals provided in circumferential edge portions of a block layout and said terminal target of said terminal cells.

11. The semiconductor integrated circuit device according to claim 10,
wherein at least one of said terminal cells each includes a capacitor device.

12. The semiconductor integrated circuit device according to claim 10,
wherein at least one of said terminal cells each includes a buffer device, any one of input and output terminals of which is connected with a terminal target.

13. The semiconductor integrated circuit device according to claim 10,
wherein at least one of said terminal cells each is provided to have a cell function, connected with said target metal.

14. The semiconductor integrated circuit device according to claim 10,
wherein at least one of said terminal cells each is formed independent of any one of input and output terminals of said buffer device to be connected with said terminal for interconnecting said integrated circuit blocks.

15. The semiconductor integrated circuit device according to claim 10,
wherein at least one of said terminal cells each includes a power and ground strap.

16. The semiconductor integrated circuit device according to claim 10,
wherein at least one of said terminal cells each is formed having any one of a width larger than a pitch, and of a height larger than that of terminals of a plurality of functional cells.

17. The semiconductor integrated circuit device according to claim 10,
wherein at least one of said terminal cells each is provided therewithin with a diode device.

18. A semiconductor integrated circuit device comprising:
a plurality of integrated circuit blocks, said integrated circuit blocks being interconnected by wiring;
a plurality of block terminals provided in circumferential edge portions of a block layout; and
at least one of terminal cells each provided inside of said block layout for use in connecting with a terminal in said integrated circuit block, said terminal cells each including a terminal target metal that is different from, and formed in a layer higher at least by one layer than, ordinary target metals originally included in a block netlist;
wherein
a metal provided as a target by said terminal cells each is formed including a plurality of cells which have a structure of any one of single layered and multi-layered and include said target metal different from each other, and
wherein
an interconnection among said integrated circuit blocks is carried out by preferentially placing said terminal cells according to a direction of wiring connection with said integrated circuit block and to a preferential wiring direction, and by interconnecting said integrated circuit blocks by way of said block terminals provided in circumferential edge portions on a block layout and said terminal target of said terminal cells.

19. The semiconductor integrated circuit device according to claim 18,
wherein at least one of said terminal cells each includes a capacitor device.

20. The semiconductor integrated circuit device according to claim 18,
wherein at least one of said terminal cells each includes a buffer device, any one of input and output terminals of which is connected with a terminal target.

21. The semiconductor integrated circuit device according to claim 18,
wherein at least one of said terminal cells each is provided to have a cell function, connected with said target metal.

22. The semiconductor integrated circuit device according to claim 18,
wherein at least one of said terminal cells each is formed independent of any one of input and output terminals of said buffer device to be connected with said terminal for interconnecting said integrated circuit blocks.

23. The semiconductor integrated circuit device according to claim 18,
wherein at least one of said terminal cells each includes a power and ground strap.

24. The semiconductor integrated circuit device according to claim 18,
wherein at least one of said terminal cells each is formed having any one of a width larger than a pitch, and of a height larger than that of terminals of a plurality of functional cells.

25. The semiconductor integrated circuit device according to claim 18,
wherein at least one of said terminal cells each is provided therewithin with a diode device.

26. A method for placement and routing of a semiconductor integrated circuit device, comprising the steps of:
forming a block netlist;
forming a plurality of terminal cells each including a terminal target metal that is different from, and formed in a layer higher at least by one layer than, ordinary target metals originally included in said block netlist;
adding said terminal cell to an input/output terminal included in said block netlist, to be subsequently adopted newly as a block terminal;
obtaining coordinates of said terminal cell from a layout obtained through autoplacement and routing steps;
forming a layout including only said terminal cells;
providing block terminals in circumferential edge portions on said block layout by laying out said layout thereonto;
forming a block layout for a terminal target provided in said integrated circuit block with each of said terminal cells as a termination; and
interconnecting said integrated circuit blocks by way of said block terminals provided in circumferential edge portions on a block layout and said terminal target of said terminal cells.

27. The method according to claim 26,
wherein at least one of said terminal cells each includes a capacitor device.

28. The method according to claim 26,
wherein at least one of said terminal cells each includes a buffer device, any one of input and output terminals of which is connected with a terminal target.

29. The method according to claim 26,
wherein at least one of said terminal cells each is provided to have a cell function, connected with said target metal.

30. The method according to claim 26,
wherein at least one of said terminal cells each is formed independent of any one of input and output terminals of said buffer device to be connected with said terminal for interconnecting said integrated circuit blocks.

31. The method according to claim 26,
wherein at least one of said terminal cells each includes a power and ground strap.

32. The method according to claim 26,
wherein at least one of said terminal cells each is formed having any one of a width larger than a pitch, and of a height larger than that of terminals of a plurality of functional cells.

33. The method according to claim 26,
wherein at least one of said terminal cells each is provided therewithin with a diode device.

34. A semiconductor integrated circuit device comprising:
at least one integrated circuit block, said at least one integrated circuit block being interconnected to another integrated circuit block by wiring,
wherein said at least one integrated circuit block is provided with at least one terminal cell including a terminal target metal that is different from, and formed in a layer higher at least by one layer than, an ordinary target metal originally included in a block netlist.

35. A semiconductor integrated circuit device comprising:
at least one integrated circuit block, said at least one integrated circuit block being interconnected to another integrated circuit block by wiring,
wherein said at least one integrated circuit block is provided with at least one terminal cell including a terminal target metal that is different from, and formed in a layer higher at least by one layer than, an ordinary target metal originally included in a block netlist representing original connections within said at least one integrated circuit block including connections to original Input/Output terminals formed by said ordinary target metal, wherein said terminal target metal is used for providing connection to at least one other integrated circuit block in lieu of the original Input/Output terminals.

36. A semiconductor integrated circuit device comprising:
a plurality of integrated circuit blocks, said integrated circuit blocks being interconnected by wiring:
a plurality of block terminals provided in circumferential edge portions of a block layout; and
a plurality of terminal cells each provided inside of said block layout for use in connecting with a terminal in said integrated circuit block, said terminal cells each including a terminal target metal that is different from, and formed in a layer higher at least by one layer than, ordinary target metals originally included in a block netlist representing original connections within said integrated circuit blocks including connections to the plurality of block terminals, wherein said terminal target metal is used for providing connection to at least one other integrated circuit block in lieu of at least a portion of the plurality of block terminals;
wherein
an interconnection among said integrated circuit blocks is carried out by way of said block terminals provided in circumferential edge portions of a block layout and said terminal target metal of said terminal cells.

* * * * *